(12) United States Patent
Nakata et al.

(10) Patent No.: US 6,841,886 B2
(45) Date of Patent: Jan. 11, 2005

(54) LAYOUT STRUCTURE FOR A FLIP CHIP SEMICONDUCTOR INTEGRATED CIRCUIT

(75) Inventors: Tsuyoshi Nakata, Kawasaki (JP); Toshikazu Ootake, Kawasaki (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/219,194

(22) Filed: Aug. 15, 2002

(65) Prior Publication Data

US 2003/0038377 A1 Feb. 27, 2003

(30) Foreign Application Priority Data

Aug. 22, 2001 (JP) ........................................ 2001-251129

(51) Int. Cl.⁷ .............................................. H01L 23/48
(52) U.S. Cl. ...................... 257/778; 257/738; 257/207; 257/208; 257/211
(58) Field of Search ................................. 257/778, 737, 257/738, 772, 203, 207, 208, 209, 211

(56) References Cited

U.S. PATENT DOCUMENTS 6,498,396 B1   12/2002   Arimoto ..................... 257/737

FOREIGN PATENT DOCUMENTS

| JP | 07-022510 | 1/1995 | ........... H01L/21/82 |
| JP | 09-107048 | 4/1997 | ........... H01L/23/12 |
| JP | 11-150204 | 6/1999 | ........... H01L/23/12 |
| JP | 2000-050240 | 2/2000 | ........... H01L/21/82 |
| JP | 2000-150802 | 5/2000 | ........... H01L/27/04 |

*Primary Examiner*—Nathan J. Flynn
*Assistant Examiner*—Pershelle Greene
(74) *Attorney, Agent, or Firm*—Hayes Soloway P.C.

(57) ABSTRACT

There is disclosed a flip chip semiconductor integrated circuit, which comprises an internal cell, an I/O buffer as an interface between the internal cell and an external unit, a solder ball, a GND or power supply wire, and an I/O buffer unit arranged on a chip. In this case, the components except the I/O buffer unit are formed in a unit and arranged on the chip, and the I/O buffer unit includes a signal solder ball for transferring signals with the external unit, an I/O buffer having a signal terminal connected to the signal solder ball, a first I/O buffer GND wire connected to a GND terminal of the I/O buffer, and a first I/O buffer power supply wire connected to a power supply terminal of the I/O buffer.

19 Claims, 25 Drawing Sheets

LAYOUT STRUCTURE FOR A FLIP CHIP SEMICONDUCTOR INTEGRATED CIRCUIT

BACKGROUND OF THE INVENTION

1. Field of the Invention

The present invention relates to a flip chip semiconductor integrated circuit, and more particularly to a layout structure of a flip chip semiconductor integrated circuit.

2. Description of the Prior Art

A flip chip semiconductor integrated circuit (abbreviated to FC IC, hereinafter) has a feature of connecting a package and a chip with each other through a spherical solder ball instead of conventional wire bonding or tape automated bonding (TAB), and a structure, in which the solder ball as a pad can be arranged on a full surface of the chip.

Hereinafter, a first conventional example will be described with reference to FIGS. 26 to 28. FIG. 26 is a plan view showing a layout structure of an FC IC according to the first conventional example. In FIG. 26, the FC IC is seen through from above. The FC IC of the first conventional example has a structure, in which a plurality of input/output buffers (referred to as I/O buffers, hereinafter) 101 are one-dimensionally arranged on four sides of a chip 351, an internal cell region 3152 is provided to be surrounded with a row of the I/O buffers 101 arranged on each side, and a solder ball is arranged on a full surface of the chip. In FIG. 26, a reference numeral 121 denotes an internal cell, and 2535 a RAM.

FIG. 27 is a partially expanded plan view of the FC IC of FIG. 26. The plurality of I/O buffers 101 arrayed in an X direction (or Y direction), and solder balls 113, 114, 115, 1033 and 1134 arranged in a Y direction (or X direction) are interconnected by drawer wires 3216, 3217 and 3218.

The solder balls are classified as an I/O buffer GND solder ball 113, an I/O buffer power supply solder ball 114, a signal solder ball 115, an internal cell GND solder ball 1033, and an internal cell power supply solder ball 1134. The drawer wires are classified as an I/O buffer GND drawer wire 3216, an I/O buffer power supply drawer wire 3217, and a signal drawer wire 3218.

A signal of the I/O buffer 101 is transmitted through signal drawer wire 3218 to the signal solder ball 115 arranged an upper part in a region of the I/O buffer 101, or on an upper part outside the region. When the plurality of I/O buffers 101 are arranged side by side, the I/O buffer GND wires 107 of the respective I/O buffers 101 are connected to each other, and the I/O buffer power supply wires 108 are connected to each other.

Then, the I/O buffer GND wire 107 is connected through the I/O buffer GND drawer wire 3216 to the I/O buffer GND solder ball 113 arranged on the upper part in the region of the I/O buffer 101 or on the upper part outside the region. The I/O buffer power supply wire 108 is connected through the I/O buffer power supply drawer wire 3217 to the I/O buffer power supply solder ball 114 arranged on the upper part in the region of the I/O buffer 101 or on the upper part outside the region. Accordingly, a power supply potential and a GND potential are supplied from the I/O buffer power supply solder ball 114 and the I/O buffer GND solder ball 113 to the I/O buffer 101.

FIG. 28 is a sectional view of the FC IC shown in FIG. 27, specifically showing a structure of connection between the signal solder ball 115 and the I/O buffer 101. In FIG. 28, a reference numeral 300 denotes an insulating film. The I/O buffer 101 and the internal cell 121 are arranged on a substrate 255.

An I/O buffer internal signal terminal 209 of the I/O buffer 101, and an internal cell signal terminal 232 of the internal cell 121 are connected to each other through a lower inter-signal wire 229. Similarly, internal cell signal terminals 232 of different internal cells 121 are connected to each other through the inter-signal wire 229. An I/O buffer signal terminal 112 is connected to the signal solder ball 115 through the signal drawer wire 3218, a through-hole 3157, and an upper barrier metal 158.

The FC IC of the first conventional example shown in FIGS. 26 to 28 has a feature that it also functions as an FC IC substrate, where one not-shown pad is arranged outside the I/O buffer 101, and a peripheral IC connecting a package with a chip through a bonding wire or TAB, and the solder balls 113, 114, 115, 1033 and 1134 are arrayed on a full chip surface.

Next, a second conventional example is described with reference to FIGS. 29 and 30. FIG. 29 is a plan view showing a layout structure of an FC IC according to the second conventional example. The second conventional example was presented by an applicant of the present invention in Japanese Patent Application No. 2000-050240. In FIG. 29, the FC IC is seen through from above.

The second conventional example has a structure, in which combinations of an I/O buffer 101, an I/O buffer GND solder ball 113, an I/O buffer power supply solder ball 114, a signal solder ball 115, an I/O buffer GND drawer wire 3216, an I/O buffer power supply drawer wire 3217, and a signal drawer wire 3218 are collected in a group 3453, and this group 3453 is housed in a region of an integral multiple of a section definition 3454.

A signal terminal 112 of the I/O buffer 101 is connected to the solder ball 115 through the signal drawer wire 3218, a not-shown through-hole, and an upper barrier metal 158. A GND terminal 110 of the I/O buffer 101 is connect t o the I/O buffer GND solder ball 113 through the I/O buffer GND drawer wire 3216, the not-shown through-hole, and the upper barrier metal 158. A power supply terminal 111 of the I/O buffer 101 is connected to the I/O buffer power supply solder ball 114 through the I/O buffer power supply drawer wire 3217, the not-shown through-hole, and the upper barrier metal 158. Accordingly, a GND potential and a power supply potential of the I/O buffer are supplied from the I/O buffer GND solder ball 113 and the I/O buffer power supply solder ball 114 installed nearby.

FIG. 30 is a chip layout plan view, in which each group 3453 of FIG. 29 is arranged on a chip 351, and only double crossed GND wire and power supply wire 3519 of the I/O buffer 101 are shown. The drawing specifically shows a state where the double crossed GND wire and power supply wire arranged adjacently to each other are interconnected in the group 3453. The second conventional example shown in FIGS. 29 and 30 has a feature that each group 3453 can be freely arranged on the chip 351.

Designing of a cell base IC can be generally classified into a product designing process for specifically designing an IC by realizing a circuit for each product such as arrangement of the I/O buffer 101 and the internal cell 121 or wiring between the signal terminals, and a base designing process for preparing a database necessary for automating produce designing, such as solder ball arrangement, designation of the I/O buffer 101 and the internal cell region 3152, power supplying wiring, circuits thereof, or layout designing.

For designing of each product, an automatic designing tool or the like is used based on the database prepared by the base designing. In designing of each product, if a problem regarding the base designing occurs, the number of backtracking man-hours is large, increasing designing TAT (number of process days). Accordingly, occurrence of problems in designing each product is prevented by verifying problems to be expected in the base designing, such as a potential reduction in the internal cell region.

Next, a conventional method of designing an FC IC b product is described with reference to FIG. 31. FIG. 31 is a flowchart showing the conventional method of designing an FC IC product. First, as designing information for each product, a design rule (geometric design rule) 1601 containing information such as a wiring pitch or the like, package information 1602 containing information regarding coordinates of the solder balls 113 to 115, 1033 and 1134, a solder ball pitch or the like, and a customer specification 1603 containing information regarding function describing data, pin arrangement, the number of pins or the like are prepared beforehand.

Subsequently, a designer carries out simulation of a function level by using a simulator or the like based on the customer specification to check an the operation of the function level (step 1605), and then carries out logic synthesis (step 1606) to generate circuit information 1607, which includes circuit blocks of the I/O buffer 101, the internal cell 121 and the like as components.

Then, in step 3607, base designing is carried out based on the design rule 1601, the package information 1602, the customer specification 1603, and the circuit information 1607, and a base database 1608 containing information regarding arrangement of the I/O buffer 101, arrangement of the solder ball or the like is prepared. This step 3607 is specific to the FC IC, and its detail will be described with reference to FIG. 32.

Then, the designer roughly arranges the I/O buffer 101, the internal cell 121 including a RAM or a macro, the power supply wire and the like based on the circuit information 1607 and the base database 1608 (step 1609). Then, the designer temporarily decides a wiring length between the circuit blocks based on the base database 1608 by using a computer or the like, and carries out temporary wiring length simulation by using its electric load (step 1610).

Here, the designer checks a result of the temporary wiring length simulation, and checks whether the IC is operating as expected or not (step 1611). If there is a problem, the rough arrangement made in step 1609 is changed (step 1613), and then the process returns to step 1610.

If there are no problems found in step 1611, the designer establishes the circuit arrangement of the entire IC including other circuits added to the roughly arranged circuit blocks by the computer, and automatic wiring is carried out between the circuits (step 1612). Here, since real wiring lengths in the chip are all established, the designer carries out operation checking and design rule verification by real wiring length timing simulation considering electric loads of the wires (step 1614).

Then, the designer checks results of the real wiring length timing simulation and the design rule verification, corrects the arrangement made in step 1612 if there is a problem (Step 1616), and returns to step 1614. If there are no problems in step 1611, the designer prepares mask data 1617 of the IC chip by the computer.

Next, a conventional method of designing a base of an FC IC is described with reference to FIG. 32. FIG. 32 is a flowchart showing the conventional method of designing the base of the FC IC. FIG. 32 shows in detail step 3607 of FIG. 31. First, as designing information of each product, a design rule 1601, package information 2602, a customer specification 1603, and circuit information 1607 generated during product designing of FIG. 31 are prepared beforehand.

Then, the designer calculates an area of an internal region based on the customer specification 1603 and the previous circuit information 1607 by using a computer or the like, and also the number of I/O pins (step 1805). Then, the designer calculates a chip size based on the calculated area of the internal region and the calculated number of I/O pins by using the computer or the like (step 1806).

Then, as shown in FIG. 29, based on the package information 1602, the designer collects combinations of an I/O buffer 101, an I/O buffer GND solder ball 113, an I/O buffer power supply solder ball 114, a signal solder ball 115, an I/O buffer GND drawer wire 3216, an I/O buffer power supply drawer wire 3217, and a signal drawer wire 3218 in a group 3453 (step 3707).

At this time, the number of combinations of the I/O buffer 101, the I/O buffer GND solder ball 113, the I/O buffer power supply solder ball 114, the signal solder ball 115, the I/O buffer GND drawer wire 3216, the I/O buffer power supply drawer wire 3217, and the signal drawer wire 3218 varies from product to product, and depends on the customer specification 1603.

Then, the designer checks an impedance characteristic of the signal drawer wire 3218 (step 3708). The designer checks the impedance characteristic (step 3709), and if there is a problem, changes the combination shapes or the number of combinations of the I/O buffer 101, the I/O buffer GND solder ball 113, the I/O buffer power supply solder ball 114, the signal solder ball 115, the I/O buffer GND drawer wire 3216, the I/O buffer power supply drawer wire 3217, and the signal drawer wire 3218 grouped in step 3707. The designer then adjusts the impedance characteristic of the signal drawer wire 3218 (step 3711), and returns to step 3708.

If there are no problems in step 3709, the designer temporarily arranges the group 3453, a RAM 2535, a macrocell and the like on a chip 351 (step 3710). Then, the designer arranges a GND wire and a power supply wire of an internal cell 121 by avoiding the RAM 2535, the macrocell and the like based on power supply wire pitch information of the design rule 1601, connects the GND wire to an internal cell GND solder ball 1033, and the power supply wire to an internal cell power supply solder ball 1134 (step 3712).

Then, the designer makes impedance models of the GND wire and the power supply wire of the internal cell 121 based on a result of the temporary arrangement in step 3710 and a result of the wiring in step 3712 by using the computer or the like (step 3713). Subsequently, the designer estimates a potential reduction based on the prepared circuit models by using a circuit simulator (step 1814).

The designer checks a result of the potential reduction simulation (step 1815). If there is a problem, the designer changes the combination shapes or the number of combinations of the I/O buffer 101, the I/O buffer GND solder ball 113, the I/O buffer power supply solder ball 114, the signal solder ball 115, the I/O buffer GND drawer wire 3216, the I/O buffer power supply drawer wire 3217, and the signal drawer wire 3218 collected in the group, adjusts resistances of the I/O buffer GND drawer wire 3216 and the I/O buffer power drawer wire 3217 (step 3717), and returns to step 3708.

If there are no problems in step 1815, the designer registers information regarding the arrangement of the GND wire and the power supply wire, the arrangement of the group 3453, the pin arrangement or the like on a base database 1608 (step 1816). Accordingly, layout designing of the I/O buffer 101 and the solder balls of the FC IC is finished. In steps thereafter, an FC IC is designed for each product based on the base database 1608. Next, conventional problems are described. First, as shown in FIGS. 27 and 29, in the conventional FC IC, because of a difference in wiring length among the signal drawer wires 3218, skewing (phase shift) occurs among signals of the I/O buffers 101, which results in delay and fluctuation. Thus, a problem of an erroneous operation of the circuit has been inherent.

Especially, in the FC IC of the second conventional example shown in FIG. 29, in the case of the double cross structure of the GND and power supply wires of the plurality of I/O buffers shown in FIG. 30, it is necessary to arrange the I/O buffers adjacently to each other, variance occurs in relative positions of the I/O buffer signal terminal 112 of the I/O buffer 101 and the signal solder ball 115, and a difference in wiring length among the signal drawer wires 3218 becomes larger than that in the first conventional example.

In the conventional FC IC, as shown in FIG. 28, as the signal drawer wire 3218 of the I/O buffer 101 passes on the internal cell 121, parasitic capacitance between the signal drawer wire 3218 of the I/O buffer 101 and the inter-signal wire 229 of the internal cell 121 causes propagation of crosstalk noise, and delay and fluctuation in the internal circuit. Thus, a problem of an erroneous operation of the circuit has been inherent. In particular, following a higher speed of the circuit achieved in recent years, the foregoing problems have become more conspicuous.

In the conventional method of designing the FC IC, the combination of the I/O buffer 101 with the solder balls 113 to 115, 1033 and 1134 depends on a specification of each product, and it is necessary to add the layout information grouping the I/O buffer 101, the solder balls 13 to 115, 10333 and 1134, and the drawer wires 3216 to 3218 to the base database 1608 for product designing. Thus, a problem of longer product design TAT (process days) has been inherent.

If there is a problem with impedance matching or a potential reduction as a result of arranging the group 3453, the GND wire and the power supply wire, it is necessary to adjust or correct the grouped layout information. Thus, the problem of much longer design TAT has been inherent.

BRIEF SUMMARY OF THE INVENTION

Objects of the Invention

An object of the present invention is to provide an FC IC capable of improving an impedance characteristic between an I/O buffer and a signal solder ball, and reducing crosstalk noise between the I/O buffer and an internal cell.

SUMMARY OF THE INVENTION

There is provided a flip chip semiconductor integrated circuit, including an internal cell, an I/O buffer as an interface between the internal cell and an external unit, a solder ball, a GND or power supply wire, which are grouped in a unit, and arranged on a chip. In this case, an I/O buffer unit is arranged on the chip, which includes a signal solder ball for transferring a signal with the external unit, an I/O buffer having a signal terminal connected to the signal solder ball, a first I/O butter.GND wire connected to a GND terminal of this I/O buffer, and a first I/O buffer power supply wire connected to a power supply terminal of the I/O buffer.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

The present invention has a feature that an FC IC can be constructed by preparing various units beforehand, such as a unit having an I/O buffer and a solder ball arranged, a unit having an internal cell arranged, a unit having a GND wire for an I/O buffer and a solder ball arranged, a unit having a power supply wire for an I/O buffer and a solder ball arranged, a unit having a GND wire for an internal cell and a solder ball arranged, a unit having a power supply wire for an internal cell and a solder ball arranged, and a unit having no solder balls arranged, and arranging the respective units on an IC chip, and a layout of the I/O buffer and the solder ball can be changed without damaging an impedance characteristic between the I/O buffer and the solder ball by changing the arrangement of the respective units during specification or design changing.

Figure 1:
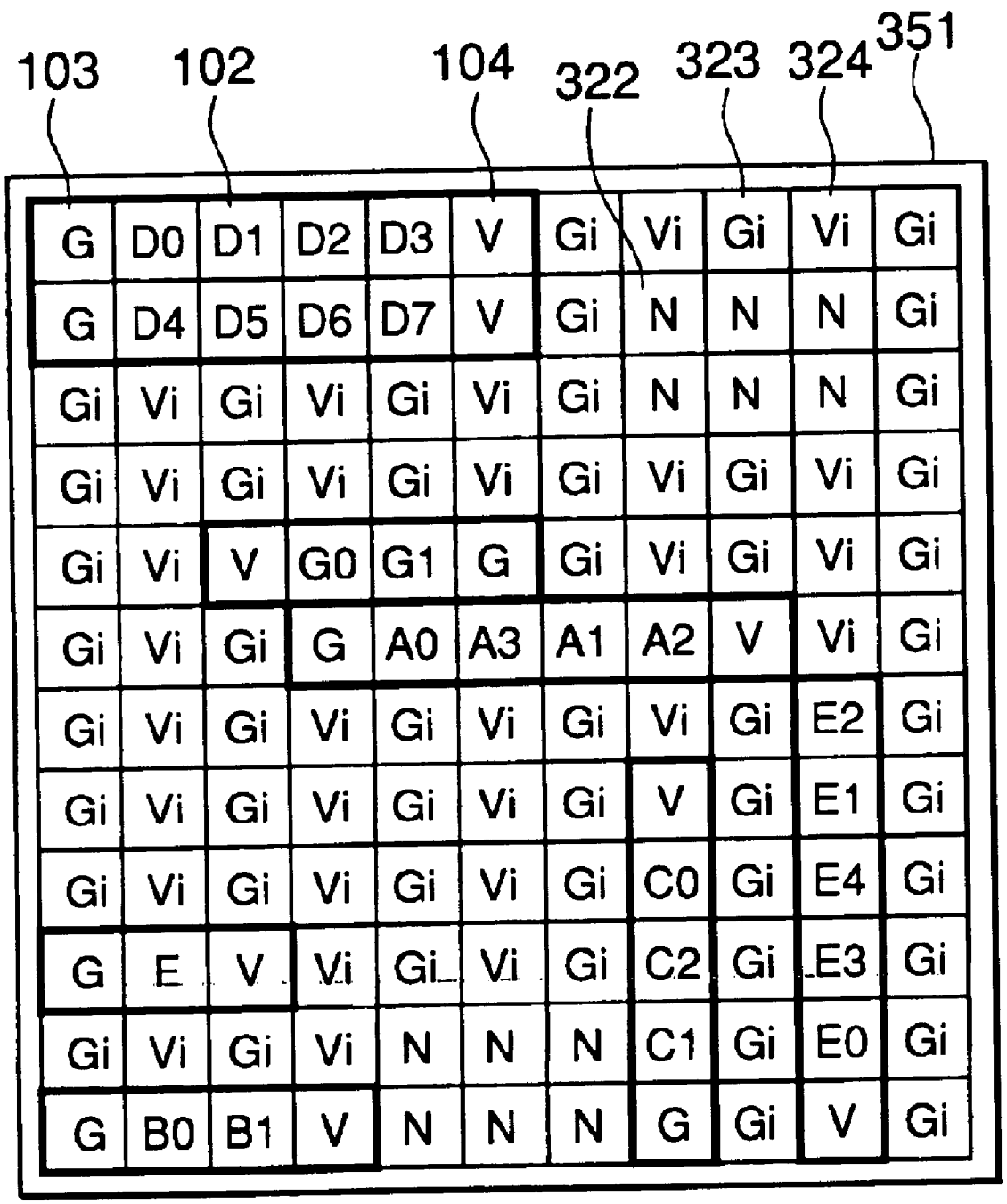
FIG. 1 is a chip layout plan view of a flip chip IC according to a first embodiment of the present invention.

Hereinafter, the preferred embodiments of the present invention are described with reference to the accompanying drawings. FIG. 1 is a chip layout plan view of an FC IC according to a first embodiment of the present invention. A chip 351 includes an I/O buffer unit 102 having an I/O buffer and a signal solder ball, an I/O buffer GND unit 103 having an I/O buffer GND solder ball 113, an I/O buffer power supply unit 104 having an I/O buffer power supply solder ball, an internal cell unit 322 having an internal cell, an internal cell GND Unit 323 having an internal cell GND solder ball, and an internal cell power supply unit 324 having an internal cell power supply ball.

In FIG. 1, each of "A0" to "A3", "B0", "B1", "C0" to "C2", "D0" to "D7", "E0" to "E4", "F", "G0", and "G1" denotes an I/O buffer unit 102, "G" an I/O buffer GND unit 103, "V" an I/O buffer power supply unit 104, "N" an internal cell unit 322, "Gi" an internal cell GND unit 323, and "Vi" an internal cell power supply unit 324.

Figure 2:
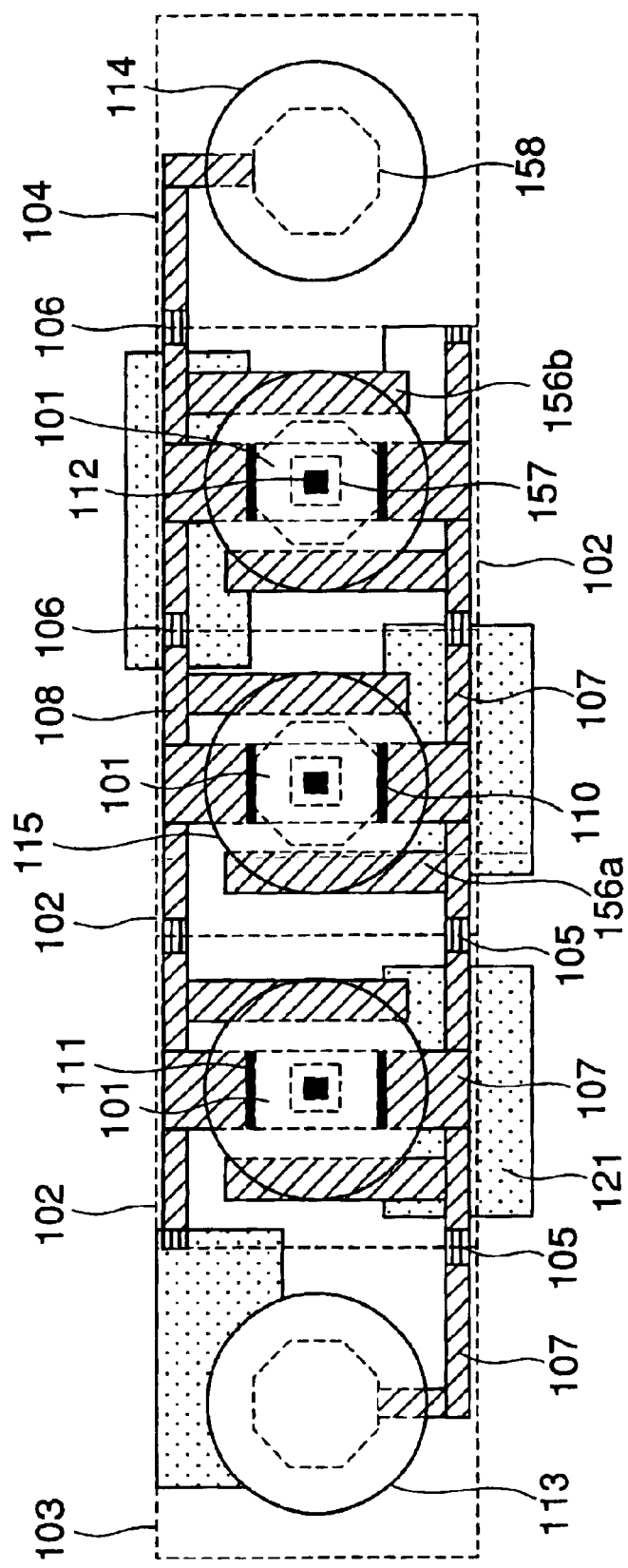
FIG. 2 is a partially expanded view of the flip chip IC of FIG. 1.

FIG. 2 is a partially expanded plan view of the FC IC of FIG. 1. In FIG. 2, the FC IC is seen through from above. In the embodiment, an I/O buffer GND unit having an I/O buffer GND solder ball 113, three I/O buffer units 102 respectively having I/O buffers 101 and signal solder balls 115, and an I/O buffer power unit 104 having an I/O buffer power supply solder ball 114 are arranged on a substrate. An internal cell 121 is arranged in a region excluding the I/O buffer 101.

An I/O buffer GND terminal 110 of each I/O buffer 101 is connected to the I/O buffer GND solder ball 113 through an I/O buffer GND wire 107, and I/O buffer unit GND terminal 105 and an upper barrier metal 158.

Similarly, an I/O buffer power supply terminal 111 of each I/O buffer 101 is connected to the I/O buffer power supply solder ball 114 through an I/O buffer power supply wire 108, an I/O buffer unit power supply terminal 106 and the upper barrier metal 158. Accordingly, a GND potential and a power supply potential are supplied from the I/O buffer GND solder ball 113 and the I/O buffer power supply solder ball 114 to the I/O buffer 101.

An I/O buffer signal terminal 112 of the I/O buffer 101 is connected to the signal solder ball 115 through a through-hole 157 and the upper barrier metal 158. A shield wire 156a is connected to the I/O buffer GND wire 107, and a shield wire 156b to the I/O buffer power supply wire 108. Specific constitution of each unit will be described later.

Figure 3:
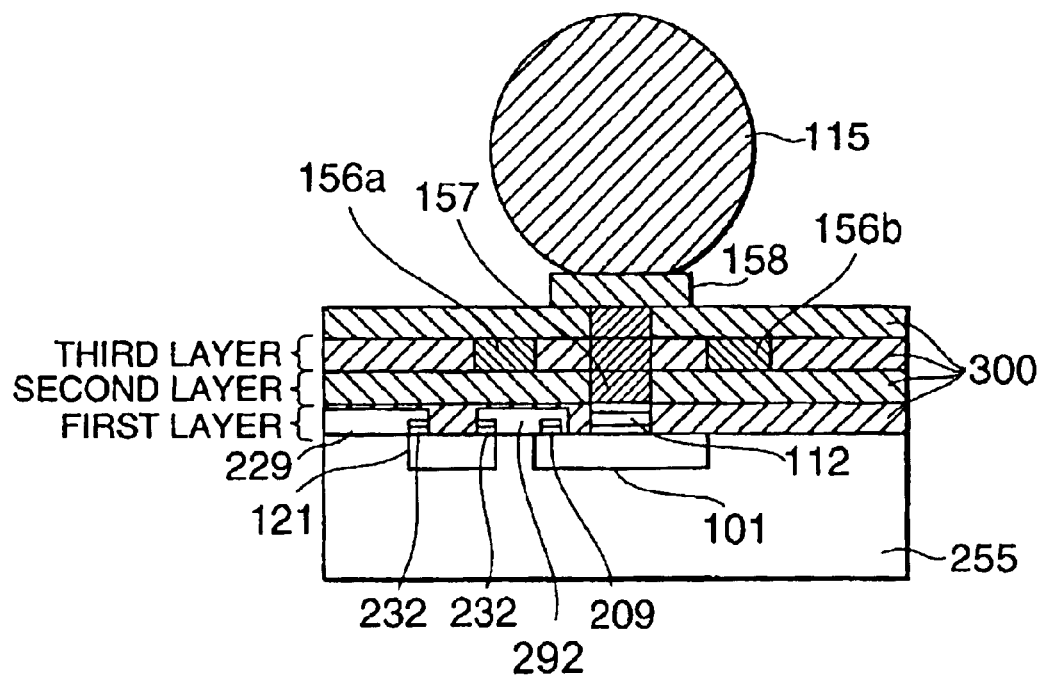
FIG. 3 is a sectional view of the clip chip IC of FIG. 2.

FIG. 3 is a sectional view of the FC IC shown in FIG. 2, specifically showing a connection structure between the signal solder ball 115 and the I/O buffer 101. In FIG. 3, a reference numeral 300 denotes an insulating film. On a substrate 255, the I/O buffer 101 and the internal cell 121 are arranged, and first, second and third layers are further arranged, on which metal wires are arranged. In FIG. 3, interlayer insulating films between the first and second layers, and between the second and third layers are omitted.

An I/O buffer internal signal terminal 209 of the I/O buffer 101, and an internal cell signal terminal 232 of the internal cell 121 are connected to each other through an inter-signal wire 292 of the first layer by an automatic wring tool or the like. Similarly, internal cell signal terminals 232 of different internal cells 121 are connected to each other through the inter-signal wire 229.

The I/O buffer signal terminal 112 is connected to the signal solder ball 115 through the through-hole 157 and the upper barrier metal 158. The shield wires 156a and 156b are arranged between the internal cell 121 and the signal solder ball 115.

Figure 4:
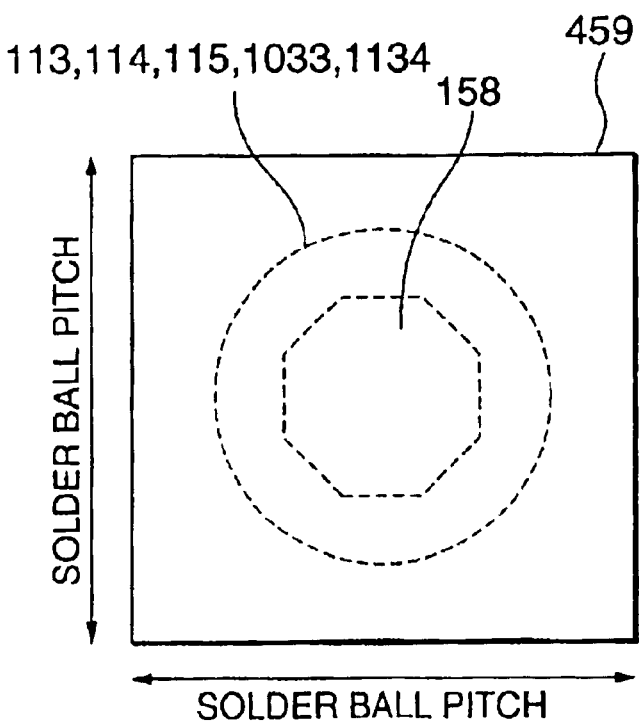
FIG. 4 is a plan view showing a layout of a third layer wire of a basic unit in the first embodiment of the present invention.

Next, the composition of a basic unit as the basis for each unit will be described. FIG. 4 is a plan view showing a layout of a third layer wire of the basic unit, and FIG. 5 a plan view showing a layout of first and second layer wires of the basic unit. The basic unit is formed in a unit region 459. Sizes of the unit region 459 in X and Y directions are equal to solder ball pitches.

The third layer wire is not specifically shown in FIG. 4. However, an insulating film is formed on the third layer, and a barrier metal 158 is formed on the insulating film. On the barrier metal 158, solder balls 113, 114, 115, 1033 and 1133 to become signal pads, power supply pads or GND pads are formed.

Figure 5:
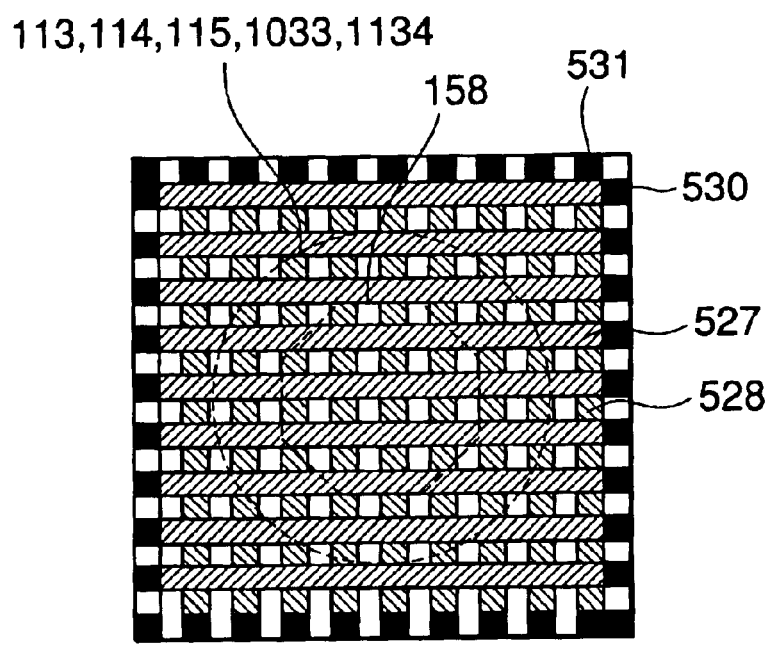
FIG. 5 is a plan view showing layouts of first and second layer wires of the basic unit in the first embodiment of the present invention.

On the first and second layers below the third layer, as shown in FIG. 5, internal cell GND wires 527 of wiring pitches divided by an integer with respect to solder ball pitches, internal cell power supply wires 528 of wiring pitches similarly divided by an integer with respect to the solder ball pitches, internal cell GND terminals 530 connected to the internal cell GND wires 527, and internal cell power supply terminals 531 connected to the internal cell power supply wires 528 are arranged.

As described lacer, the internal cell GND wires and power supply wires 527 and 528 of the first layer, and the internal cell GND wires and power supply wires 527 and 528 of the second layer are arranged in directions orthogonal to each other. The internal cell GND wire 527 of the first layer and the internal cell GND wire 527 of the second layer are connected to each other, and the internal cell power supply wire 528 of the first layer and the internal cell power supply wire 528 of the second layer are connected to each other, both through not-shown through-holes.

When the units are arranged adjacently to each other, the internal cell GND terminals 530 are connected to each other between the adjacent units, and the internal cell power supply terminals 531 are also connected to each other. Accordingly, a GND potential and a power supply potential of the internal cell 121 can be supplied to the adjacent units, thereby constructing an internal cell region 3152, in which the internal cell 121 is arranged.

Figure 6:
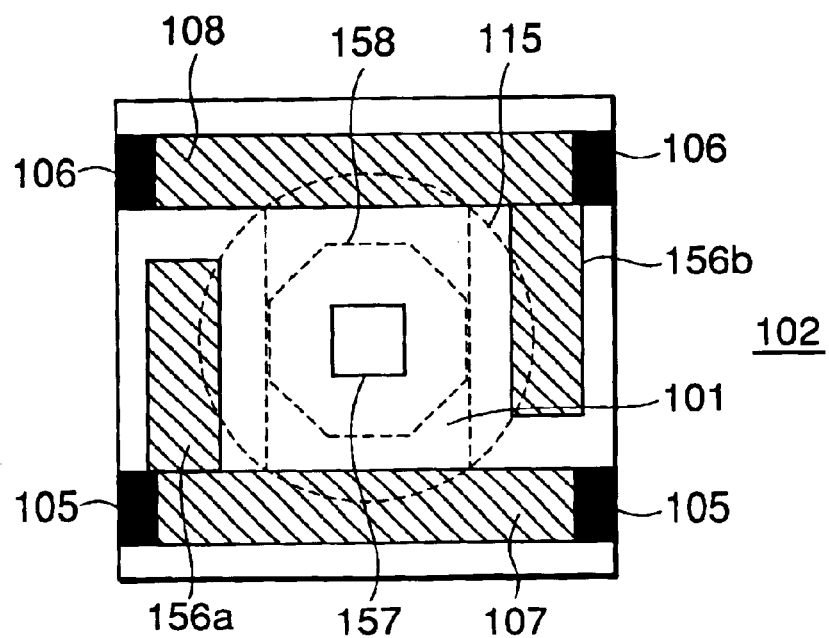
FIG. 6 is a plan view showing a layout of a third layer wire of an I/O buffer unit in the first embodiment of the present invention.

Next, constitution of the I/O buffer unit 102 shown in FIG. 2 is described with reference to FIGS. 6 and 7. FIG. 6 is a plan view showing a layout of a third layer wire of the I/O buffer unit 102 shown in FIG. 2, and FIG. 7 a plan view showing the first and second layer wires of the I/O buffer unit 102.

As shown in FIG. 6, the third layer of the I/O buffer unit 102 includes the I/O buffer GND wire 107 for connecting the GND terminal 110 of the I/O buffer 101 with the I/O buffer GND solder ball 113, the I/O buffer power supply wire 108 for connecting the power supply terminal 111 of the I/O buffer 101 with the I/O buffer power supply ball 114, the shield wire 156a connected to the I/O buffer GND wire 107, the shield wire 156b connected to the I/O buffer power supply wire 108, the I/O buffer unit GND terminal 105 for connecting the adjacent units with the I/O buffer GND wire 107, the I/O buffer power supply terminal 106 for connecting the adjacent units with the I/O buffer power supply wire 108, and the through-hole 157 for connecting the signal terminal 112 of the I/O buffer 101 with the signal solder ball 115, which are arranged thereon. An insulating film is formed on this third layer, a barrier metal 158 is formed on the insulating film, and a signal solder ball 115 is formed on the barrier metal 158.

Figure 7:
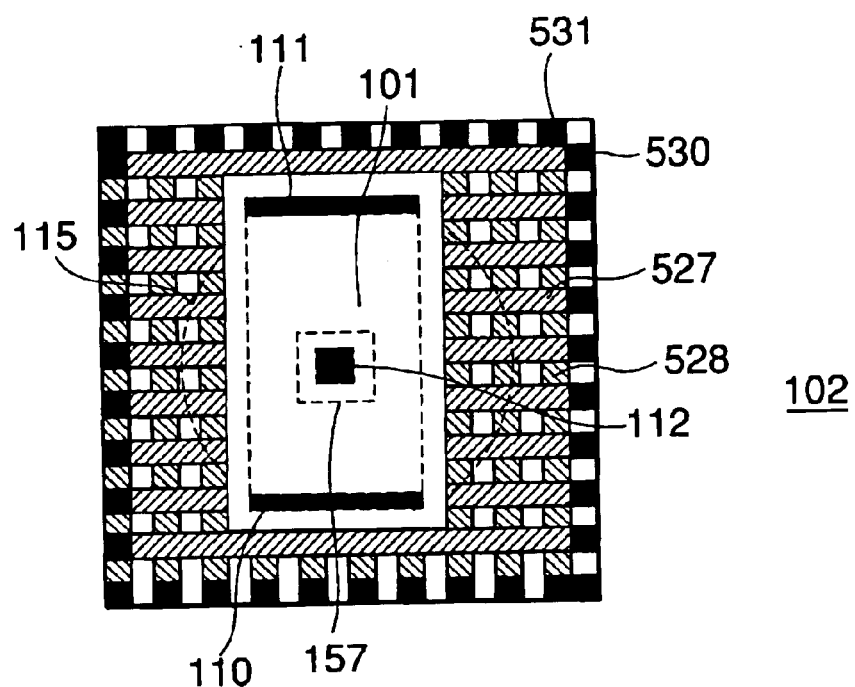
FIG. 7 is a plan view showing layouts of first and second layer wires of the I/O buffer unit in the first embodiment of the present invention.

On the first and second layers below the third layer, as shown in FIG. 7, the internal cell GND terminal 530, the internal cell power supply terminal 531, the internal cell GND and power supply wires 527 and 528 of wiring pitches divided by an integer with respect to the solder ball pitches, the GND terminal 110 of the I/O buffer 101, the power supply terminal 111 of the I/O buffer 101, the signal terminal 112 of the I/O buffer 101, and the internal signal terminal 209 (not shown in FIG. 7) of the I/O buffer 101 are arranged. Below the first layer, the I/O buffer 101 is arranged.

The signal terminal 112 of the I/O buffer 101 and the signal solder ball 115 are connected to each other through the through-hole 157 formed on the signal terminal 112, and the barrier metal 158 formed on the through-hole 157. The GND terminal 110 of the I/O buffer 101 and the I/O buffer unit GND terminal 105 are connected to each other through the I/O buffer GND wire 107 formed on the GND terminal 110. The power supply terminal 111 of the I/O buffer 101 and the I/O buffer unit power source terminal 106 are connected to each other through the I/O buffer power supply wire 108 formed on the power supply terminal 111.

Figure 8:
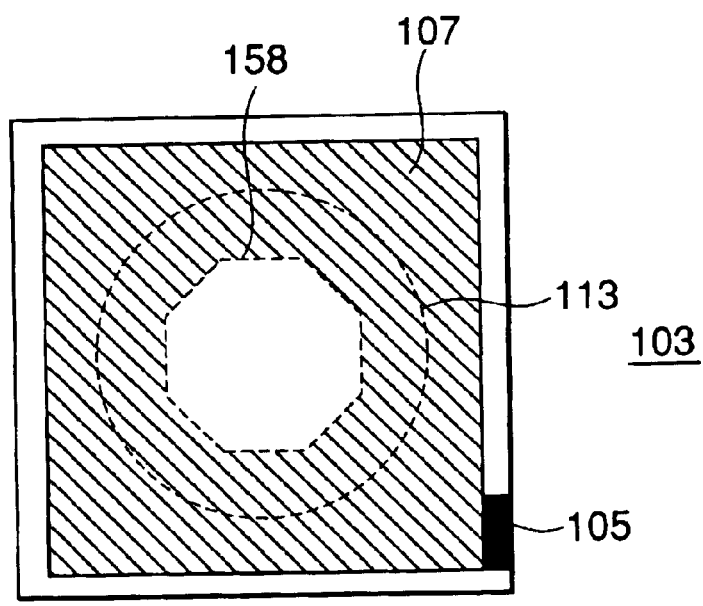
FIG. 8 is a plan view showing a layout of a third layer wire of an I/O buffer GND unit in the first embodiment of the present invention.

Next, constitution of the I/O buffer GND unit 103 shown in FIG. 2 is described. FIG. 8 is a plan view showing a layout of a third layer wire of the I/O buffer GND unit 103 shown in FIG. 2. The third layer of the I/O buffer GND unit 103 includes the I/O buffer unit GND terminal 105, and the I/O buffer GND wire 107, which are arranged thereon.

An insulating film is formed on this third layer, a barrier metal 158 is formed on the insulating film, and an I/O buffer GND solder ball 113 is formed on the barrier metal 158. The I/O buffer unit GND terminal 105 is connected to the I/O buffer GND solder ball 113 through the I/O buffer GND wire 107, the not-shown through-hole formed on the insulating film, and the barrier metal 158. Structures of first and second layers of the I/O buffer GND unit 103 are similar to those shown in FIG. 5, and thus description thereof will be omitted.

Figure 9:
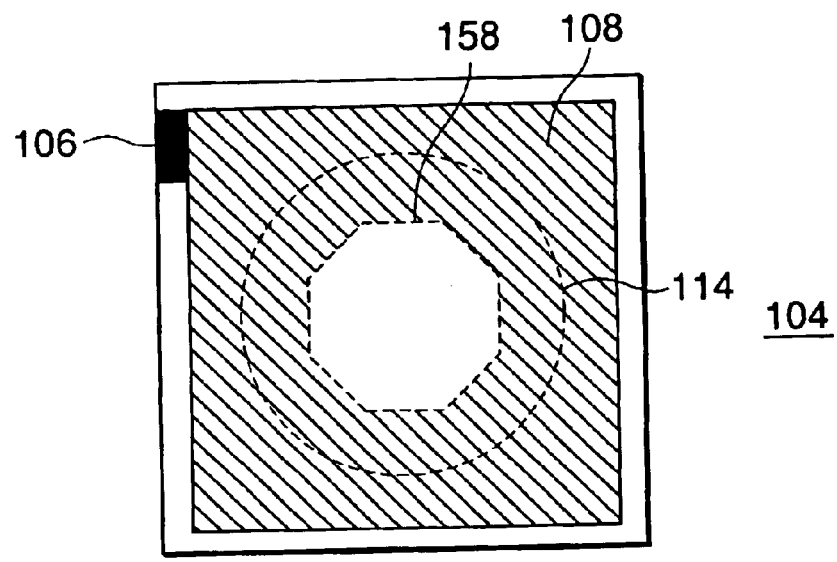
FIG. 9 is a plan view showing a layout of a third layer wire of an I/O power supply unit in the first embodiment of the present invention.

Next, constitution of the I/O buffer power supply unit 104 shown in FIG. 2 is described. FIG. 9 is a plan view showing a layout of a third layer wire of the I/O buffer power supply unit 104. The third layer of the I/O buffer power supply unit 104 includes the I/O buffer unit power supply terminal 106, and the I/O buffer power supply wire 108, which are arranged thereon.

An insulating film is formed on this third layer, a barrier metal 158 is formed on the insulating film, and an I/O buffer power supply solder ball 114 is formed on the barrier metal 158. The I/O buffer unit power supply terminal 106 is connected to the I/O buffer power supply solder ball 114 through the I/O buffer power supply wire 108, the not-shown through-hole formed on the insulating film, and the barrier metal 158. Structures of first and second layers of the I/O buffer power supply unit 104 are similar to those shown in FIG. 5, and thus description thereof will be omitted.

Figure 10:
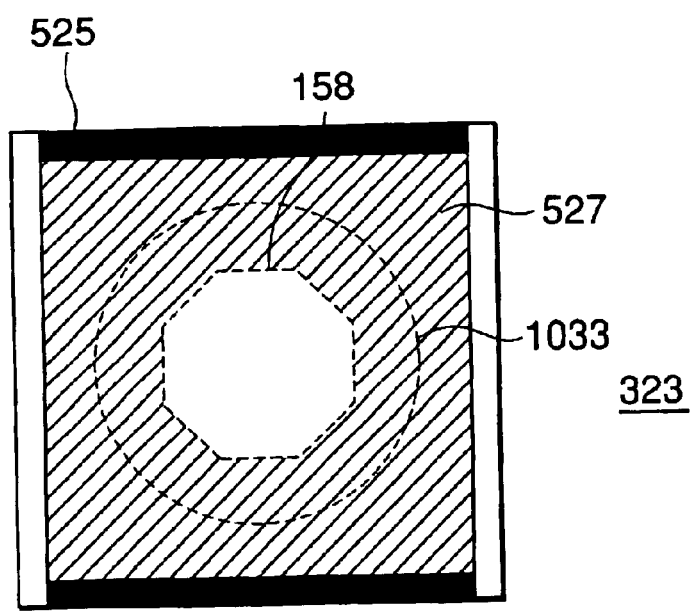
FIG. 10 is a plan view showing a layout of a third layer wire of an internal cell GND unit in the first embodiment of the present invention.

Next, constitution of the internal cell GND unit 323 is described. FIG. 10 is a plan view showing a layout of a third layer wire of the internal cell GND unit 323. The third layer of the internal cell GND unit 323 includes the internal cell unit GND terminal 525, and the internal cell GND wire 527 connected to the internal cell unit GND terminal 525, which are arranged thereon.

An insulating film is formed on this third layer, a barrier metal 158 is formed on the insulating film, and an internal cell GND solder ball 1033 is formed on the barrier metal 158. The internal cell unit GND terminal 525 is connected to the internal cell GND solder ball 1033 through the internal cell GND wire 527, the not-shown through-hole formed on the insulating film, and the barrier metal 158. If the units are arranged adjacently to each other, the internal cell unit GND terminals 525 are connected to each other between the adjacent units.

Structures of first and second layers of the internal cell GND unit 323 are similar to those shown in FIG. 5. The internal cell GND wire 527 of the third layer, and the internal cell GND wire 527 of the second layer are connected to each other through a not-shown through-hole.

Figure 11:
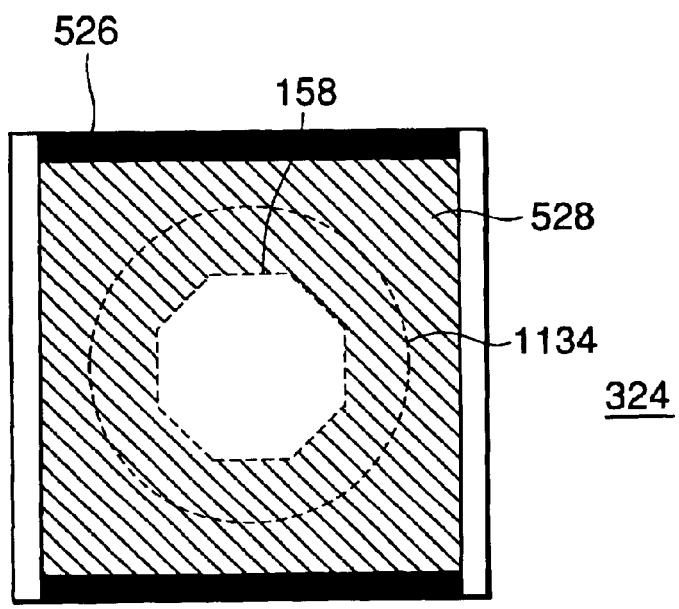
FIG. 11 is a plan view showing a layout of a third layer wire of an internal cell power supply unit in the first embodiment of the present invention.

Next, constitution of the internal cell power supply unit 324 is described. FIG. 11 is a plan view showing a layout of a third layer wire of the internal cell power supply unit 324. The third layer of the internal cell power supply unit 324 includes the internal cell unit power supply terminal 526, and the internal cell power supply wire 528 connected to the internal cell unit power supply terminal 526, which are arranged thereon.

An insulating film is formed on this third layer, a barrier metal 158 is formed on the insulating film, and an internal cell power supply solder ball 1134 is formed on the barrier metal 158. The internal cell unit power supply terminal 526 is connected to the internal cell power supply solder ball 1134 through the internal cell power supply wire 528, the not-shown through-hole formed on the insulating film, and the barrier metal 158.

Structures of first and second layers of the internal cell power supply unit 324 are similar to those shown in FIG. 5. The internal cell power supply wire 528 of the third layer, and the internal cell power supply wire 528 of the second layer are connected to each other through a not-shown through-hole.

Figure 12:
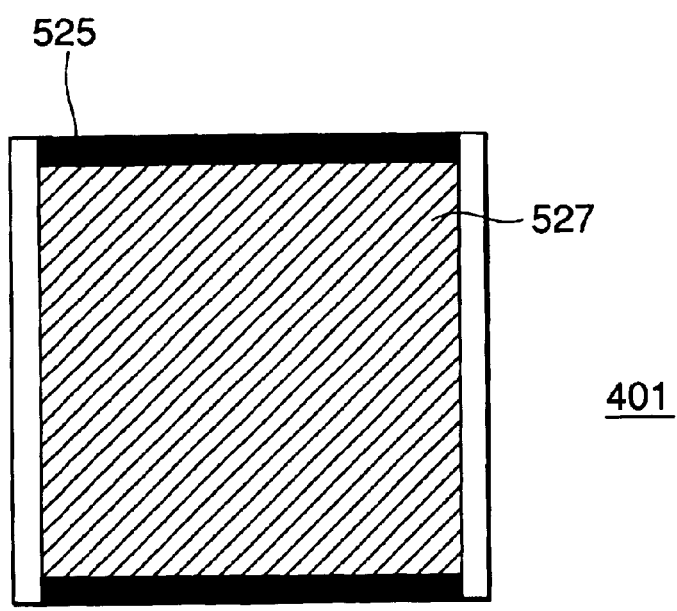
FIG. 12 is a plan view showing a layout of a third layer wire of a GND unit having no solder balls arranged in the first embodiment of the present invention.

Next, constitution of the GND unit having no solder balls arranged is described. FIG. 12 is a plan view showing a layout of a third layer wire of a GND unit 401 having no solder balls arranged. The third layer of the GND unit 401 includes the internal cell unit GND terminal 525, and the internal cell GND wire 527 connected to the internal cell unit GND terminal 525, which are arranged thereon.

Structures of first and second layers of the GND unit 401 are similar to those shown in FIG. 5, and thus description thereof will be omitted.

Figure 13:
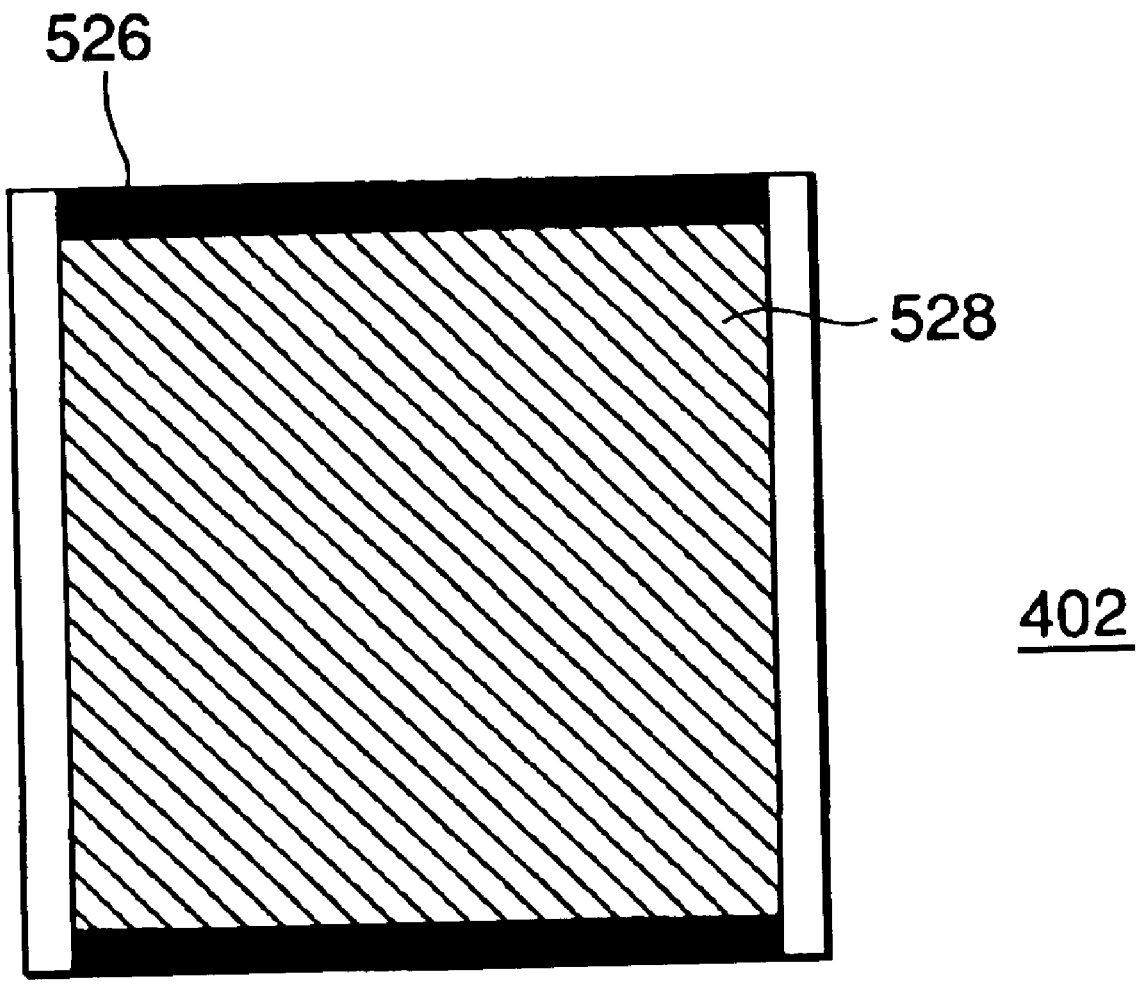
FIG. 13 is a plan view showing a layout of a third layer wire of a power supply unit having no solder balls arranged in the first embodiment of the present invention.

Next, constitution of the power supply unit having no solder balls arranged is described. FIG. 13 is a plan view showing a layout of a third layer wire of the power supply unit 402 having no solder balls arranged. The third layer of the power supply unit 402 includes the internal cell unit power supply terminal 526, and the internal cell power supply wire 528 connected to the internal cell unit power supply terminal 526, which are arranged thereon. Structures of first and second layers of the internal cell power supply unit 402 having no solder balls arranged are similar to those shown in FIG. 5, and thus description thereof will be omitted.

If the internal cell 121 is arranged in the GND unit 401 or the power supply unit 402, the GND unit 401 or the power supply unit 402 becomes the foregoing internal cell unit 322. A GND terminal of the internal cell 121 is connected to the internal cell GND wire 527 of the first layer, and a power supply terminal of the internal cell 121 to the internal cell power supply wire 528 of the first layer.

Figure 14:
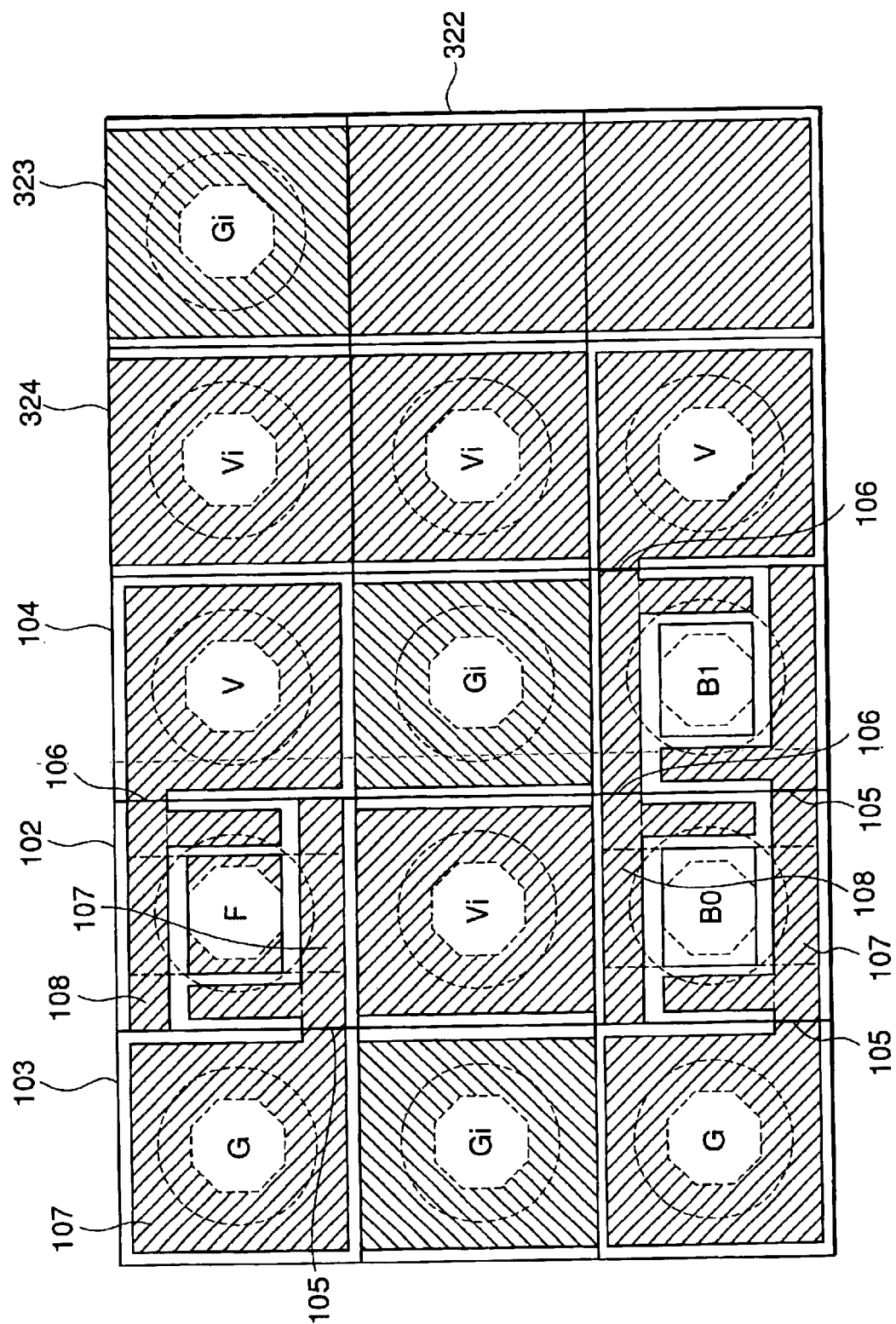
FIG. 14 is a plan view showing a layout of a third layer wire in a partial region of FIG. 1.
Figure 15:
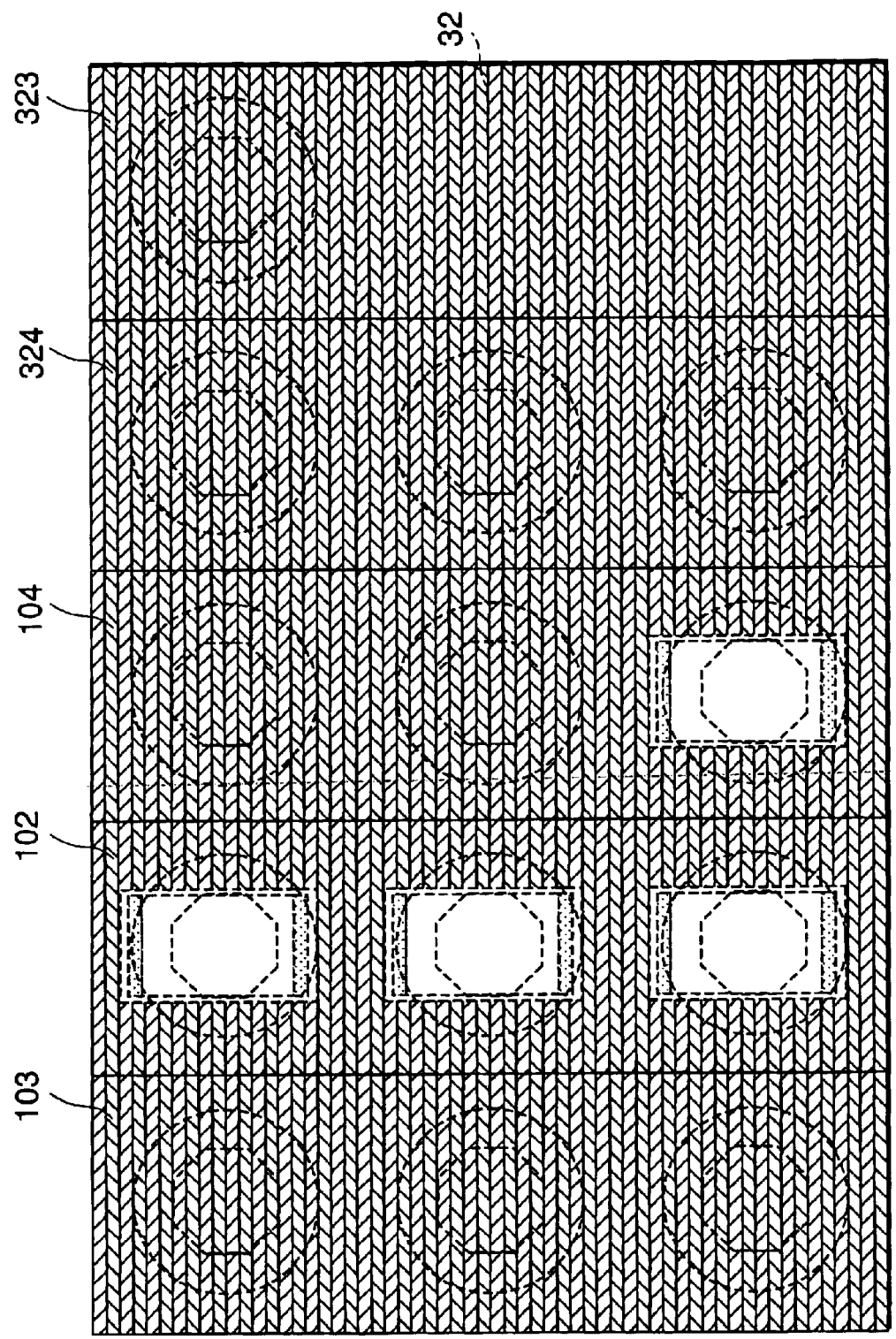
FIG. 15 is a plan view showing a layout of first and second layer wires in a partial region of FIG. 1.

As described above, the units of the seven types shown in FIGS. 7 to 13 are made from the basic unit shown in FIGS. 4 and 5, and these units are arranged side by side on the chip 351. This arrangement is shown in the chip layout pan view of FIG. 1. FIG. 14 is a plan view showing a layout of a third layer wire in a region on a left lower side of FIG. 1, and FIG. 15 a plan view showing a layout of first and second layer wires in the same region.

As shown in FIG. 14, the I/O buffer GND wire 107 of the I/O buffer unit 102 is connected through the I/O buffer unit GND terminal 105 to the I/O buffer GND wire 107 of the adjacent I/O buffer GND unit 103. The I/O buffer power supply wire 108 of the I/O buffer unit 102 is connected through the I/O buffer unit power supply terminal 106 to the I/O buffer power supply wire 108 of the adjacent I/O buffer power supply unit 104.

If the I/O buffer units 102 are adjacent to each other, the respective I/O GND wires 107 thereof are connected to each other through the I/O buffer unit GND terminal 105, and the respective I/O buffer power supply wires 108 to each other through the I/O buffer unit power supply terminal 106.

The internal cell GND wires 527 of the first and second layers of each unit are connected to the internal cell GND wires 527 of first and second layers of an adjacent unit through the internal cell GND terminal 530. The internal cell power supply wires 528 of the first and second layers of each unit are connected to the internal cell power supply wires 528 of the first and second layers of an adjacent unit through the internal cell power supply terminal 531.

Figure 16:
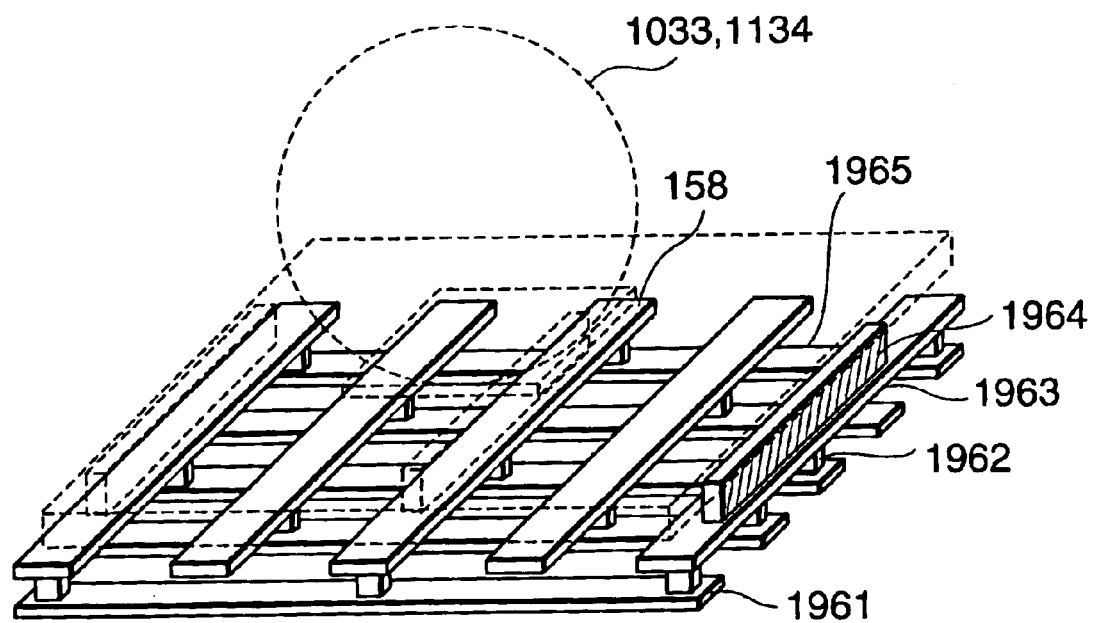
FIG. 16 is a perspective view showing a structure of internal cell GND and power supply wires in each unit.

Next, constitution of the internal cell GND and power supply wires 527 and 528 in each unit is described. FIG. 16 is a perspective view showing a structure of the internal cell GND and power supply wires 527 and 528 in each unit. FIG. 16 shows an example of an internal cell GND unit 323 or an internal cell power supply unit 324.

In each unit, internal cell GND and power supply wires 527 and 528 are alternately arranged on a first layer 1961. On a second layer 1963, internal cell GND and power supply wires 527 and 528 are alternately arranged to be orthogonal to the wires of the first layer 1961. The internal cell GND wires 527 of the first and second layers 1961 and 1963 are connected to each other by a through-hole 1962, and also the internal cell power supply wires 528 of the first and second layers 1961 and 1963 to each other by the through-hole 1962.

In the case of the internal cell GND unit 323 or the internal cell power supply unit 324, an internal cell GND wire 527 or an internal cell power supply wire 528 is arranged on a third layer 1965. The internal cell GND wires 527 of the second and third layers 1963 and 1965 are connected to each other by a through-hole 1964, and also the internal cell power supply wires 528 of the second and third layers 1963 and 1965 to each other by the through-hole 1964.

In the case of the internal cell GND unit 323, the internal cell GND wire 527 of the third layer 1965 is connected to the internal cell GND solder ball 1033 through a not-shown through-hole formed on an insulating film on the third layer 1965, and a barrier metal 158 formed on the insulating film.

In the case of the internal cell power supply unit 324, the internal cell power supply wire 528 of the third layer 1965 is connected to the internal cell power supply solder ball 1134 through the not-shown through-hole formed on the insulating film on the third layer 1965, and the barrier metal 158 formed on the insulating film. For the internal cell GND and power supply wires 527 and 528 of the third layer 1965, thick and wide wires are used to match the solder balls 1033 and 1134.

The internal cell 121 is arranged between the internal cell GND and power supply wires 527 and 528. The inter-signal wire 229 of the internal cell 121 is passed between the internal cell GND and power supply wires 527 and 528 of the first layer. The I/O buffer 101 and the internal cell 121 (macrocell or RAM) are arranged in a region having no internal cell GND or power supply wires 527 or 528.

Figure 29:
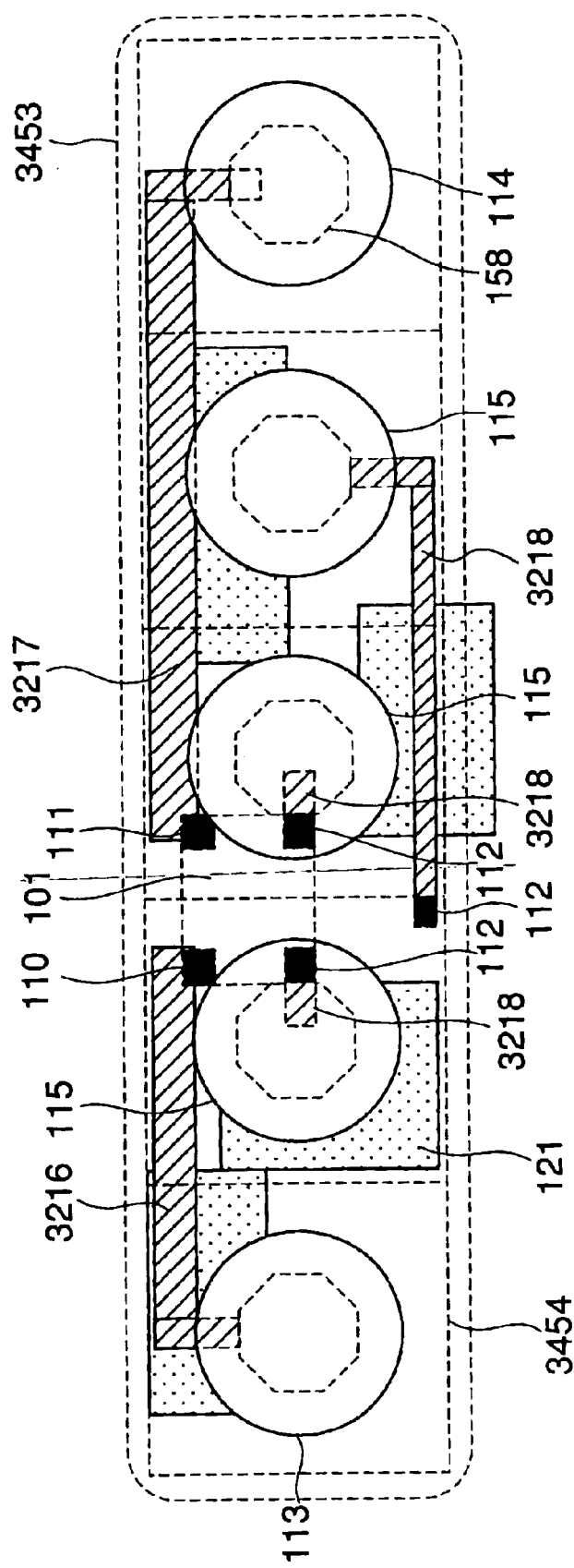
FIG. 29 is a plan view showing a layout structure of a flip chip IC according to a second conventional example.
Figure 30:
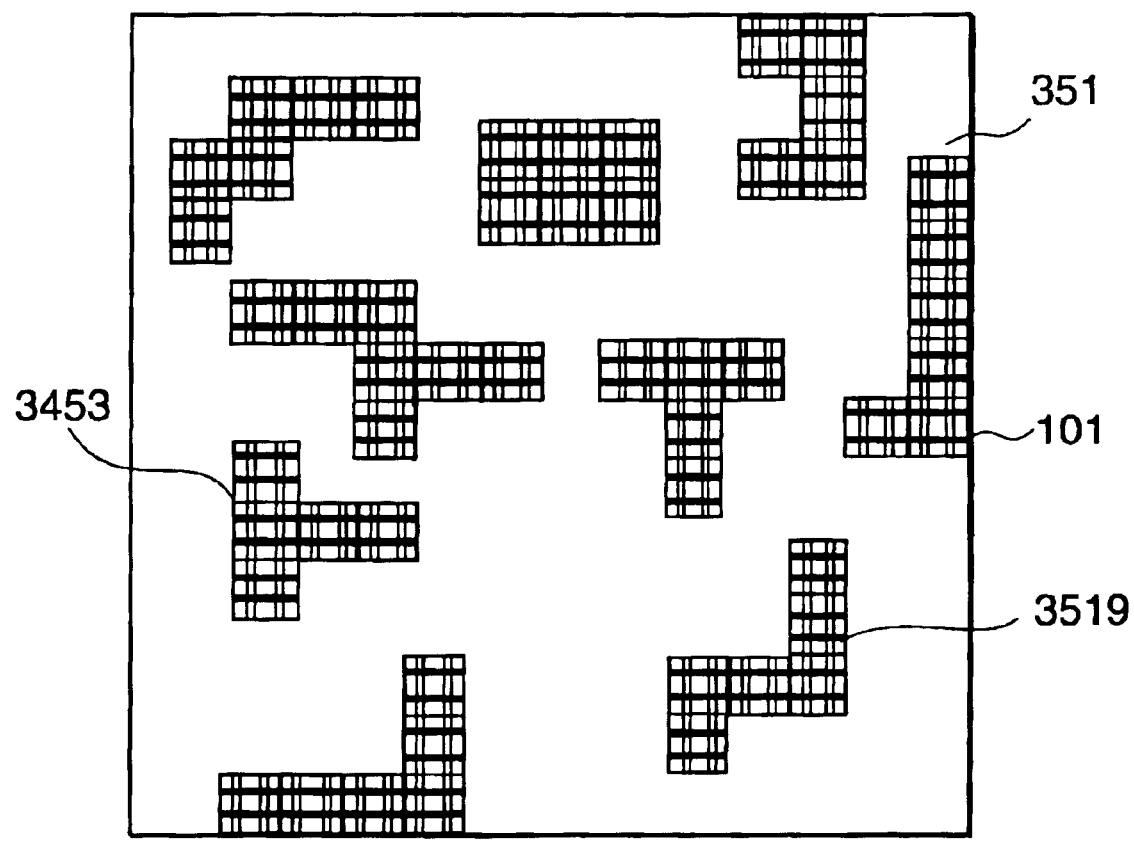
FIG. 30 is a chip layout plan view of the flip chip IC of the second conventional example.
Figure 31:
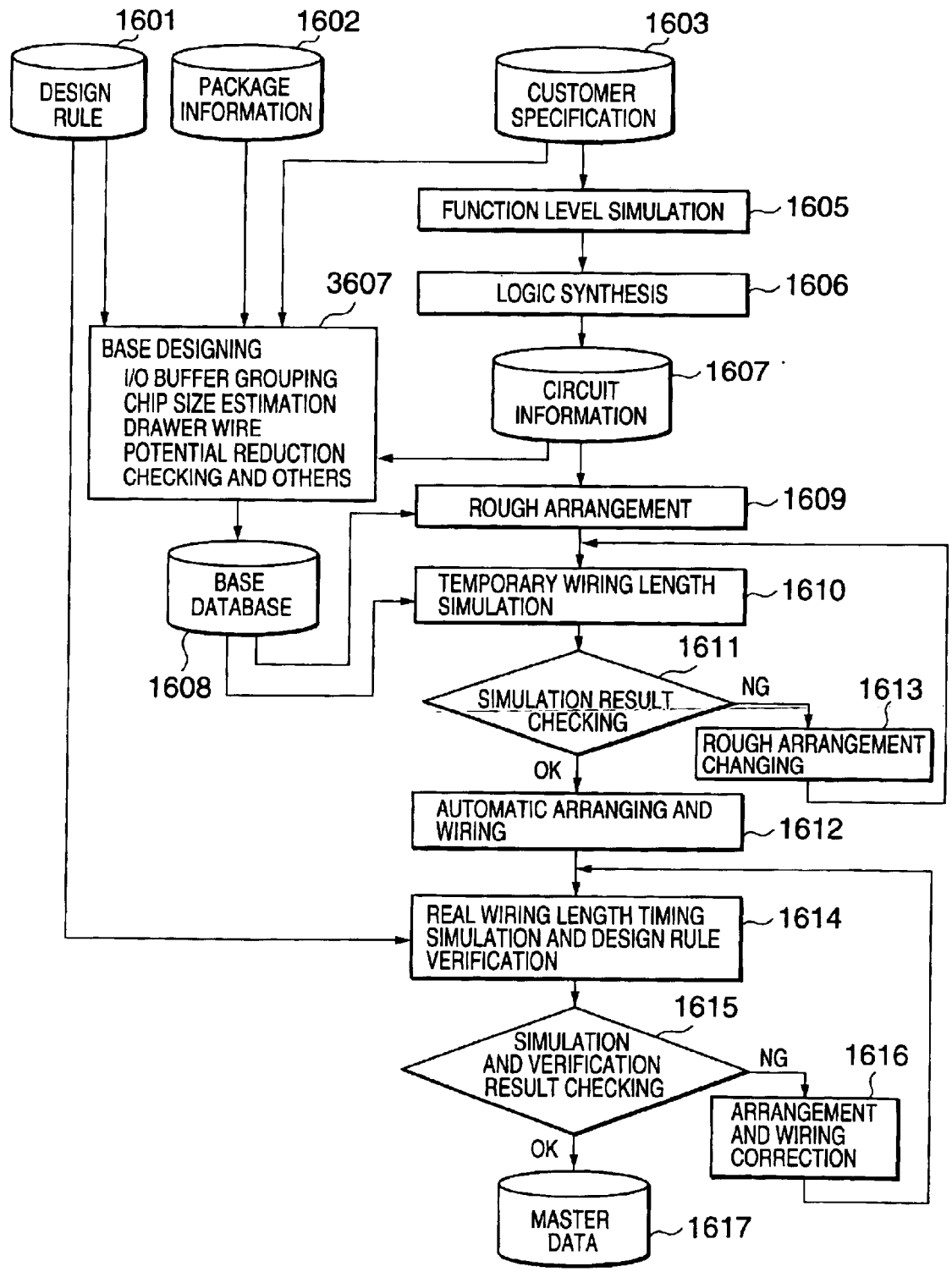
FIG. 31 is a flowchart showing a conventional method of designing a flip chip IC.

FIG. 2 shows the arrangement of a circuit equivalent to the second conventional example shown in FIG. 29. When the units are arranged side by side as shown in FIG. 2, the I/O buffer GND wires 107 of the respective units are connected to each other through the I/O buffer unit GND terminal 105, and the I/O buffer power supply wires 108 of the respective units to each other through the I/O buffer unit power supply terminal 106. In other words, the process of arranging the respective units also includes connection of the I/O buffer GND and power supply wires 107 and 108.

Accordingly, a GND potential is supplied from the I/O buffer GND solder ball 113 of the I/O buffer GND unit 103 to the GND terminal 110 of the I/O buffer 101, and a power supply potential from the I/O buffer power supply solder ball 114 of the I/O buffer power supply unit 104 to the power supply terminal 111 of the I/O buffer 101.

The I/O buffer signal terminal 112 of the I/O buffer 101 of each I/O buffer unit 102 is connected by one to one to the signal solder ball 115 arranged in the same unit. Thus, the process of arranging each unit also includes conventional pin arrangement.

As shown in FIG. 3, the I/O buffer signal terminal 112, and the signal solder ball 115 arranged directly above the signal terminal 112 are connected to each other through the through-hole 157 and the barrier metal 158. Thus, the I/O buffer signal terminal 112 and the signal solder ball 115 can be connected to each other by a shortest distance.

Further, as shown in FIG. 3, by preventing the passage of the signal drawer wire 3218 on the internal cell 121 different from the case of the conventional example, and providing the shield wires 156a and 156b between the signal drawer wires (the through-hole 257, the barrier metal 158 and the signal solder ball 115) of the embodiment and the internal cell 121, parasitic capacitance can be reduced between the signal drawer wire and the inter-signal wire 229. Thus, it is possible to reduce an effect of crosstalk noise, and jitters of the inter-signal wire 229.

Next, connection between the internal cell 121 and the internal cell GND and power supply wires 527 and 528 is described. The internal cell 121 is arranged in a region, in which the I/O buffer 101 is not arranged, and connected to the internal cell GND and power supply wires 527 and 528. Then, the internal cell GND wire 527 is connected to the internal cell GND unit 323, and the internal cell power supply wire 528 to the internal cell power supply unit 324. Accordingly, a potential is supplied from outside the chip only by arranging the units side by side.

Therefore, the unit arranging process of the embodiment also includes connection of the internal cell GND and power supply wires 527 and 528. The inter-signal wire 229 is set avoiding the region, in which the I/O buffer GND terminal 110, the I/O buffer power supply terminal 111 and the I/O buffer 101 are arranged. Thus, a conventional wiring characteristic can be secured.

According to the embodiment, by arranging the units side by side on the chip 351, the chip layout of the FC IC can be formed, which includes the I/O buffer 101, the internal cell GND wire 527, the internal cell power supply wire 528, the I/O buffer GND wire 107, the I/O buffer power supply wire 108, and the solder balls 113, 114, 115, 1033 and 1134.

Figure 17:
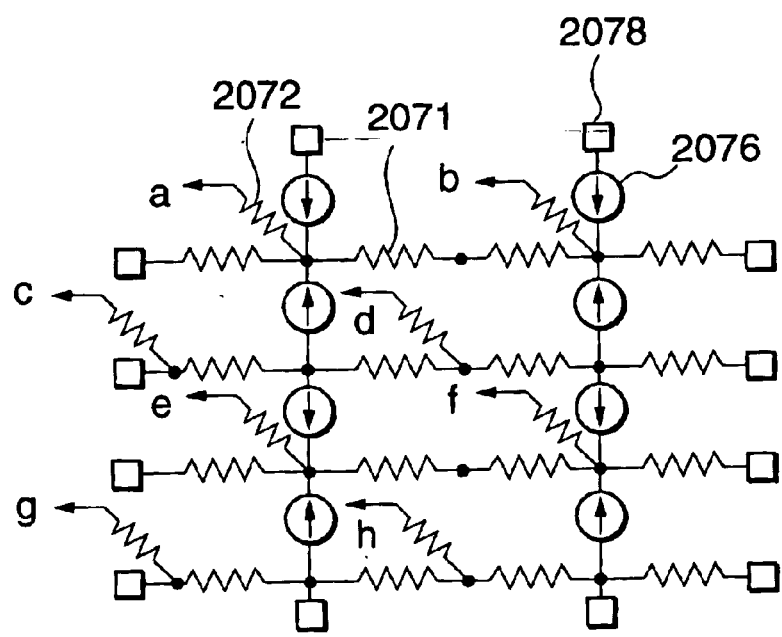
FIG. 17 is a circuit diagram showing a model of first layer wiring impedance of the internal cell GND and power supply wires of FIG. 16.

Next, a wiring impedance model of the internal structure and the internal cell region of each unit is described. FIG. 17 is a circuit diagram showing a wiring impedance model of the first layer 1961 of the internal cell GND and power supply wires 527 and 528 shown in FIG. 16, FIG. 18 a circuit diagram showing a wiring impedance model of the second layer 1963, and FIG. 19 a circuit diagram showing a wire impedance model of the third layer 1965.

Here, the first, second and third layers composed of the internal cell GND and power supply wires 527 and 528 are respectively substituted with wire resistances 2071, 2173 and 2275, and the through-holes 1962 and 1964 respectively with through-holes 2072 and 2174. Then, the internal cell 121 is substituted with a constant current source 2976, the internal cell GND solder ball 1033 with a GND potential, and the internal cell power supply solder ball 1134 with a constant current source 2277. Further, the unit power supply terminals 525 and 526 are substituted with a power supply terminal 2078 of an impedance model.

Figure 18:
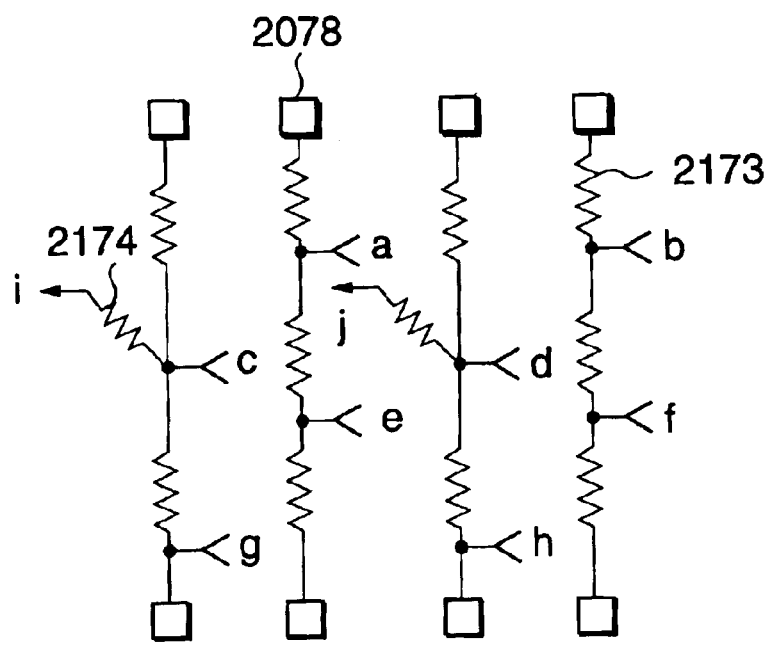
FIG. 18 is a circuit diagram showing a model of second layer wiring impedance of the internal cell GND and power supply wires of FIG. 16.
Figure 19:
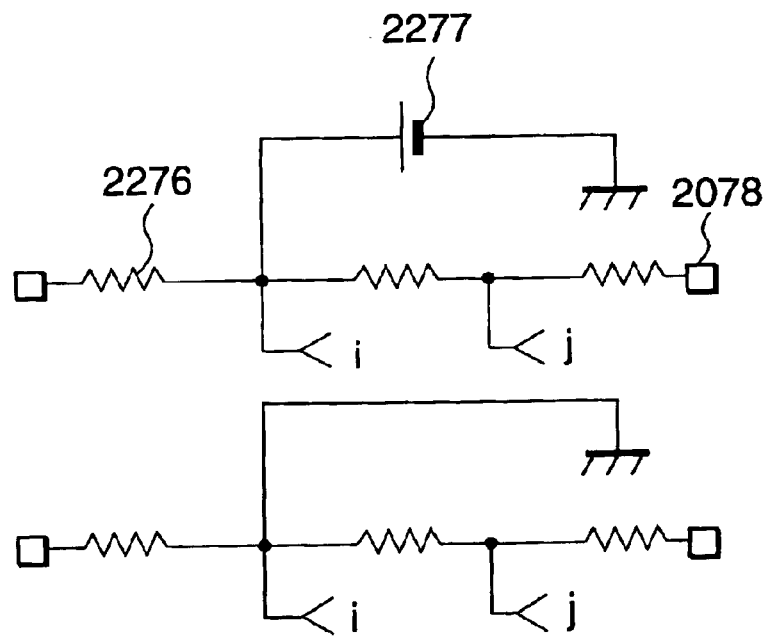
FIG. 19 is a circuit diagram showing a model of third layer wiring impedance of the internal cell GND and power supply wires of FIG. 16.

Thus, a wiring impedance model similar to that shown in each of FIGS. 17 to 19 is obtained. For an impedance circuit network of each unit, the terminals 2078 are connected to each other based on arrangement of the respective units, and an impedance circuit network of a chip layout is constructed. By this wiring impedance model, potential reductions in the GND and power supply wires of the internal cell 121 can be verified.

Figure 20:
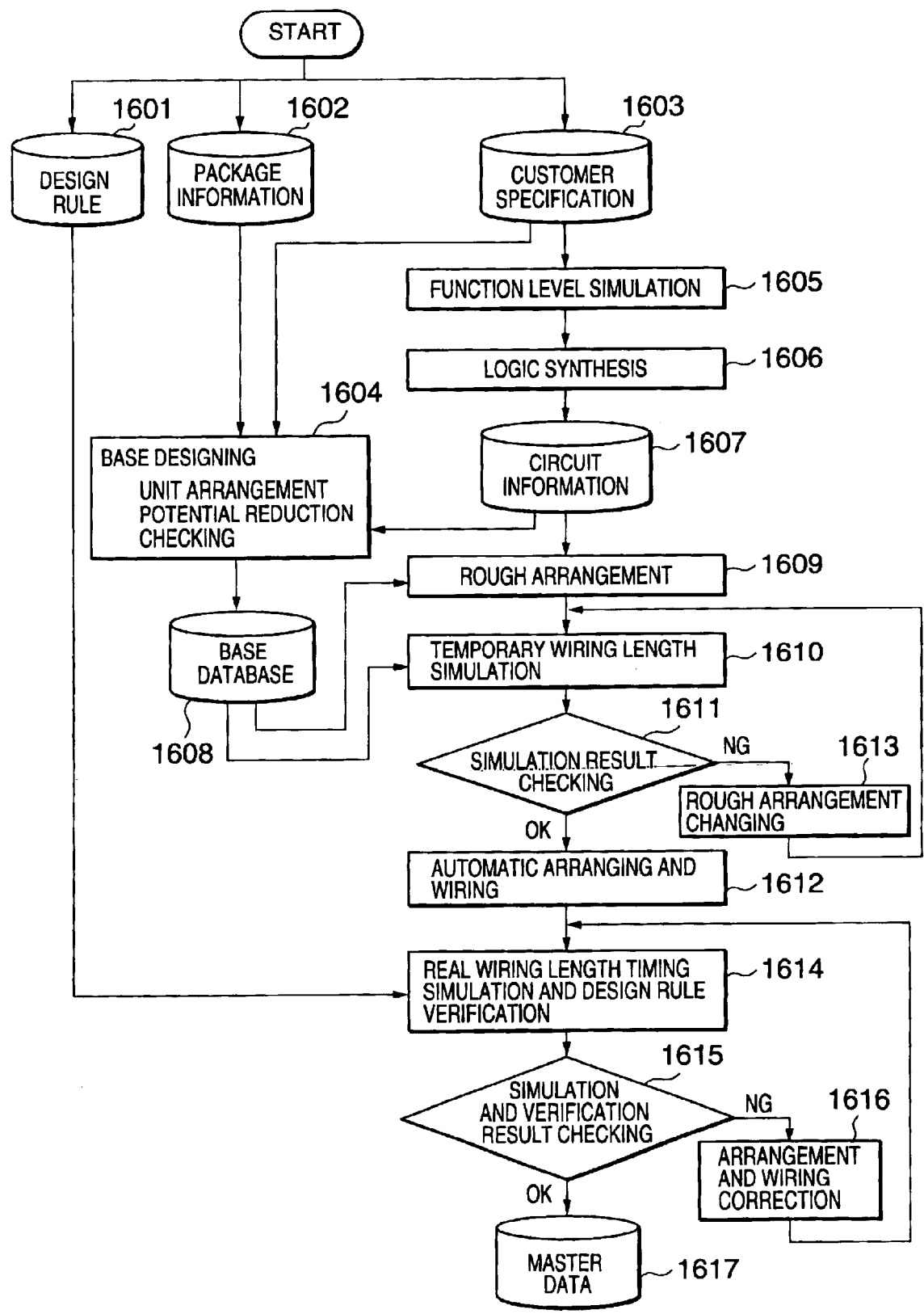
FIG. 20 is a flowchart showing a method of designing the flip chip IC of the embodiment.

Next, a method of designing an FC IC product of the present invention is described with reference to FIG. 20. FIG. 20 is a flowchart showing a method of designing an FC IC product according to the embodiment. First, as designing information for each product, a design rule (geometric design rule) 1601 containing information such as a wiring pitch or the like, package information 1602 containing information regarding coordinates of the solder balls 113 to 115, 1033 and 1134, a solder ball pitch or the like, and a customer specification 1603 containing information regarding function describing data, pin arrangement, the number of pins or the like are prepared beforehand.

Then, in step 1604, base designing is carried out based on the package information 1602 and the customer specification 1603, and a base database 1608 containing information regarding arrangement of GND and power supply wires, unit arrangement, pin arrangement or the like is generated. A detail of this step 1604 will be described with reference to FIG. 22.

Subsequently, a designer carries out simulation of a function level by using a simulator or the like based on the customer specification 1603 to check an operation of the function level (step 1605), and then carries out logic synthesis (step 1606) to generate circuit information 1607, which includes circuit blocks of the I/O buffer 101, the internal cell 121 and the like as components.

Then, in step 3607, the designer roughly arranges the I/O buffer 101, the internal cell 121 including a RAM or a macro, the power supply wire and the like based on the circuit information 1607 and the base database 1608 (step 1609). Then, the designer temporarily decides a wiring length between the circuit blocks based on the base database 1608 by using a computer or the like, and carries out temporary wiring length simulation by using its electric load (step 1610).

Here, the designer checks a result of the temporary wiring length simulation, and checks whether the IC is operated as expected or not (step 1611). If there is a problem, the rough arrangement made in step 1609 is changed (step 1613), and then the process returns to step 1610.

If there are no problems found in step 1611, the designer establishes the circuit arrangement of the entire IC including other circuits added to the roughly arranged circuit blocks by the computer, and automatic wiring is carried out between the circuits (step 1612). Here, since real wiring lengths in the chip are all established, the designer carries out operation checking and design rule verification by real wiring length timing simulation considering electric loads of the wires (step 1614).

Then, the designer checks results of the real wiring length timing simulation and the design rule verification, corrects the arrangement made in step 1612 if there is a problem (step 1616), and returns to step 1614. If there are no problems in step 1611, the designer prepares mask data 1617 of the IC chip by the computer. It is the base designing of step 1604 in the foregoing product designing method that is different from the conventional product designing method.

Figure 21:
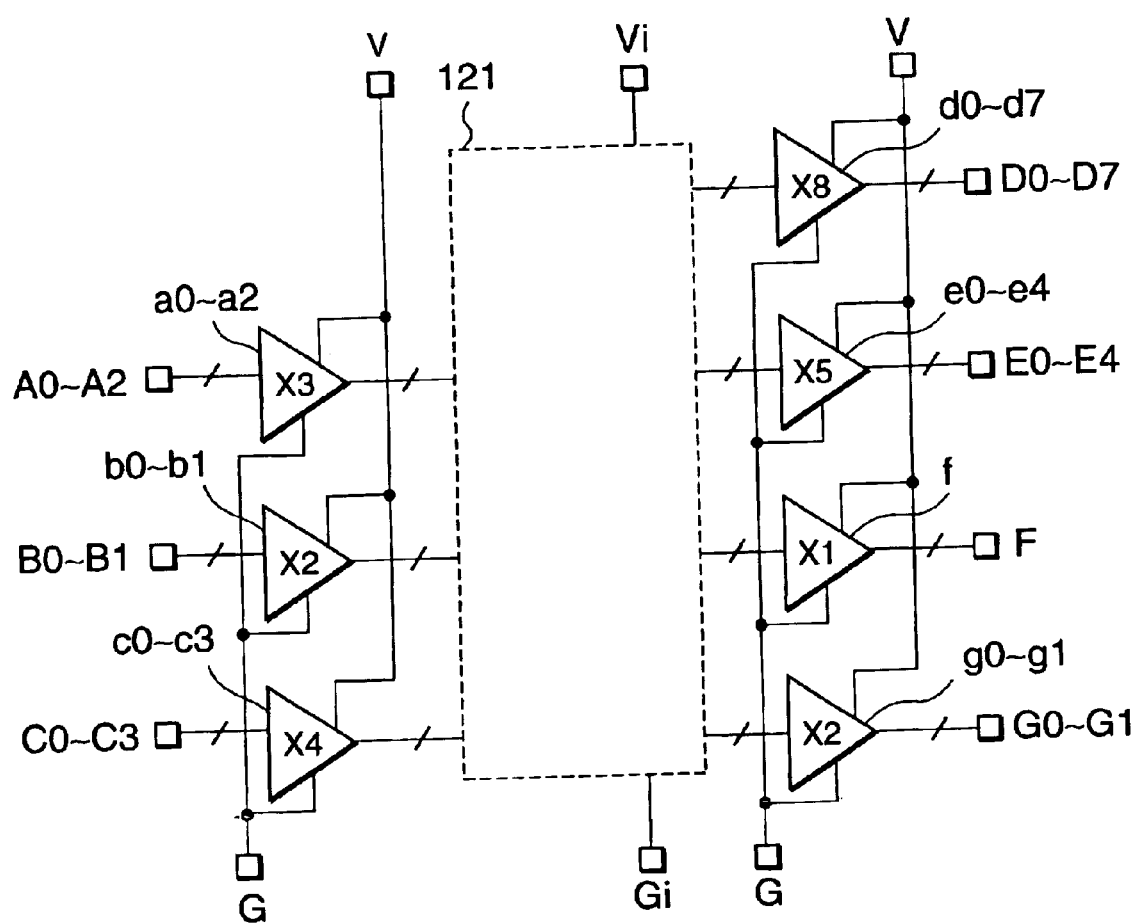
FIG. 21 is a circuit diagram showing a circuit example of the flip chip IC.
Figure 22:
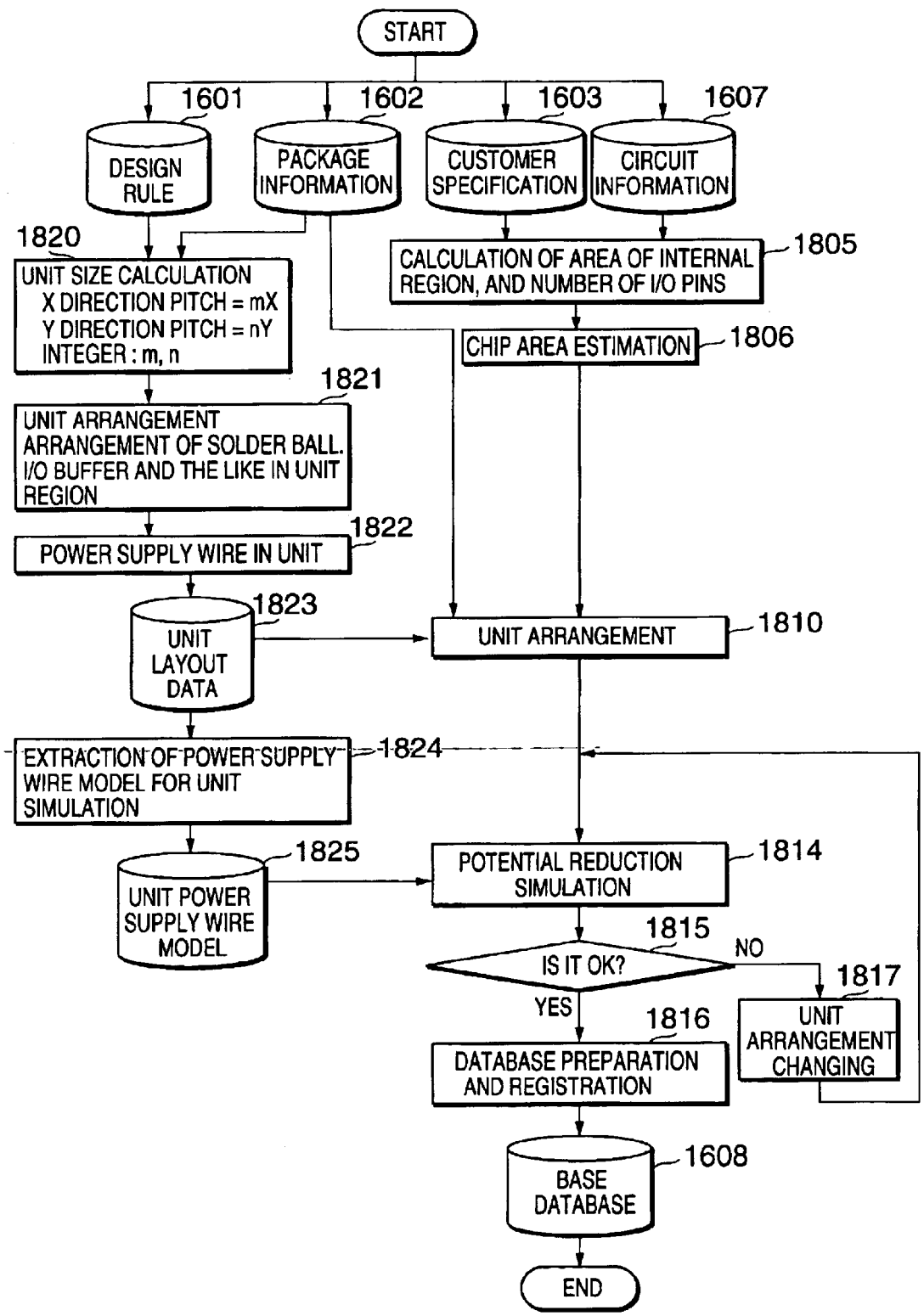
FIG. 22 is a flowchart showing a method of designing a base of the flip chip IC of the embodiment.

Next, a method of designing a base of an FC IC according to the embodiment is described with reference to FIGS. 21 and 22. FIG. 21 is a circuit diagram showing a circuit example of an FC IC, and FIG. 22 is a flowchart showing the method of designing the base of the FC IC. FIG. 22 shows in detail step 1604 of FIG. 20.

An IC shown in FIG. 21 includes input buffer circuits a0 to a2, b0 to b1, and c0 to c3, an internal cell 121, output buffer circuits d0 to d7, e0 to e4, f, and g0 to g1, input pins A0 to A2, B0 to B1, and C0 to C3, and output pins D0 to D7, E0 to E2, and G0 to G1.

It is assumed that the design rule and the package information define an I/O buffer GND potential=0 V, an I/O buffer power supply potential=1.8 V, an internal cell GND potential=0 V, an internal cell power supply potential (VDD)=1.5 V, a three-layer wiring process, a wiring pitch 1 μm, and a solder ball pitch 200 μm.

First, in order to satisfy the condition of the wiring pitch 1 μm or higher defined by the design rule 1601, the designer divides the solder ball pitch 200 μm defined by the package information 1601 by an optional integer, for example 200 to decide a power supply wiring pitch 1 μm and a unit size of 200 μm×200 μm, and decide a size of a basic unit (step 1820).

Then, the designer arranges an I/O buffer 101 and a signal solder ball 115 in an I/O buffer unit 102 with the basic unit as a base, an I/O buffer GND solder ball 113 in an I/O buffer GND unit 103, an I/O buffer power supply solder ball 114 in an I/O buffer power supply unit 104, an internal cell GND solder ball 1033 in an internal cell GND unit 323, and an internal cell power supply solder ball 1134 in an internal cell power supply unit 324 (step 1821).

Further, as shown in FIGS, 6 and 7, the designer arranges an I/O buffer GND wire 107, an I/O buffer power supply wire 108, shield wires 156a and 156b, an I/O buffer unit GND terminal 105, an I/O buffer unit power supply terminal 106, a through-hole 157, an internal cell GND terminal 530, an internal cell power supply terminal 531, an internal cell GND wire 527, and an internal cell power supply wire 528 in the I/O buffer unit 102, and prepares unit layout data 1823 indicating a layout in the I/O buffer unit 102 (step 1822).

Similarly, as shown in FIG. 8, the designer arranges an I/O buffer unit GND terminal 105, an I/O buffer GND wire 107, an internal cell GND terminal 530, an internal cell power supply terminal 531, an internal cell GND wire 527 and an internal cell power supply wire 528 in the I/O buffer GND unit 103, and prepares unit layout data 1823. As shown in FIG. 9, the designer arranges an I/O buffer unit power supply terminal 106, an I/O buffer power supply wire 108, an internal cell GND terminal 530, an internal cell power supply terminal 531, an internal cell GND wire 527, and an internal cell power supply wire 528 in the I/O buffer power supply unit 104, and prepares unit layout data 1823 (step 1822).

As shown in FIG. 10, the designer arranges an internal cell unit terminal 525, an internal cell GND terminal 530, an internal cell power supply terminal 531, an internal cell GND wire 527 and an internal cell power supply wire 528 in the internal cell GND unit 323, and prepares unit layout data 1823. As shown in FIG. 11, the designer arranges an internal cell unit power supply terminal 526, an internal cell GND terminal 530, an internal cell power supply terminal 531, an internal cell GND wire 527, and an internal cell power supply wire 528 in the internal cell power supply unit 324, and prepares unit layout data 1823 (step 1822).

Further, as shown in FIG. 12, the designer arranges an internal cell unit GND terminal 525, an internal cell GND terminal 530, an internal cell power supply terminal 531, an internal cell GND wire 527 and an internal cell power supply wire 528 in the GND unit having no solder balls arranged, and prepares unit layout data 1823. As shown in FIG. 13, the designer arranges an internal cell unit power supply terminal 526, an internal cell GND terminal 530, an internal cell power supply terminal 531, an internal cell GND wire 527, and an internal cell power supply wire 528 in the power supply unit having no solder balls arranged, and prepares unit layout data 1823 (step 1822).

Then, the designer extracts a wiring impedance model of the internal cell GND and power supply wires shown in FIGS. 17 to 19 based on the unit layout data 1823 by using the computer or the like (step 1824), and makes a power supply wire model 1825.

In this case, connection between the I/O buffer signal terminal 112 and the signal solder ball 115 is made through the through-hole 157, the upper barrier metal 158 and the like by a shortest distance. Accordingly, it is not necessary to check an impedance characteristic of the I/O buffer signal terminal 112 and the signal solder ball 115 of each product. In the stage, of product designing, the steps 3707, 3708, 3709, 3710, 3712, and 3713 necessary in the conventional product designing method can be omitted.

Then, the designer calculates an area of an internal region to be 10MGate based on the customer specification 1603 and the previous circuit information 1607 by using a computer or the like, and also the number of I/O pins to be 144 (step 1805). Then, the designer calculates a chip size to be 2.4 mm×2.4 mm based on the calculated area of the internal region and the calculated number of I/O pins by using the computer or the like (step 1806).

Subsequently, the designer arranges the respective units based on the package information 1602 and the customer specification 1603 to decide a chip layout similar to that shown in FIG. 1 (step 1810). Then, the designer prepares an impedance network model of an IC chip based on the unit power supply wiring model 1826 of each unit and the unit arranging result of step 1810 by using the computer or the like, and estimates a potential reduction based on the prepared impedance network model by using a circuit simulator (step 1814). The impedance network model of the chip can be changed according to rearrangement of the units.

The designer checks a result of the potential reduction simulation (step 1815). If there is a problem, the designer changes the unit arrangement made in step 1810 (step 1815), and returns to step 1814. If there are no problems in step 1815, the designer registers information regarding the arrangement of the GND wire and the power supply wire, the unit arrangement, the pin arrangement or the like on a base database 1608 (step 1816). Accordingly, the base designing (step 1604) of the FC IC is completed.

Advantages of the present embodiment are described with reference to FIGS. 2 and 3. As shown in FIG. 3, a first advantage of the embodiment is that the I/O buffer signal terminal 112 and the signal solder ball 115 can be connected to each other by the shortest distance, and impedance of the wires can be reduced.

According to the embodiment, since the identical I/O buffer units 102 are used for the respective I/O buffers 101, a difference in impedance characteristics among the signals processed at the respective I/O buffers is reduced, eliminating the necessity of adjusting a skewing difference among the signals.

For example, assuming that in the second conventional example of FIG. 29, a signal wire resistance is 0.04 Ω□, a through-hole resistance 2 Ω per one, parasitic capacitance of the drawer wire 1 fF/μm, a drawer wire width 10 μm, a drawer wire length 100 to 400 μm, and the number of through-holes 10×10, then a signal wire resistance is set to 0.4 to 1.6 Ω, parasitic capacitance of a drawer wire 2 to 8 pF, and a through-hole resistance to 0.02 Ω.

On the other hand, in FIG. 2, a drawer wire is only a through-hole cushion, a drawer wire width is 10 μm, a drawer wire length 10 μm, and the number of through-holes 10×10. Accordingly, a through-hole resistance is set to 0.2 Ω, and parasitic capacitance of the drawer wire to 0.1 pF.

When a skew difference between signals of the I/O buffers 101 is estimated based on a time constant of CR (capacitance and resistance), [(1.6+0.02)×8]−[(0.4+0.02)×2]=12.12 psec. is set in the second conventional example of FIG. 29. In FIG.

2, since a drawer wire length difference of signal lines is eliminated, 0 psec. is improved.

According to the embodiment, as shown in FIG. 3, by preventing the passage of the signal drawer wire 3218 on the internal cell 12 different from the case of the conventional example, and using the shield wires 156a and 156b, parasitic capacitance can be reduced between the signal drawer wire and the inter-signal wire 229. Thus, it is possible to reduce the effect of crosstalk noise, and jiggers of the inter-signal wire 229.

Figure 28:
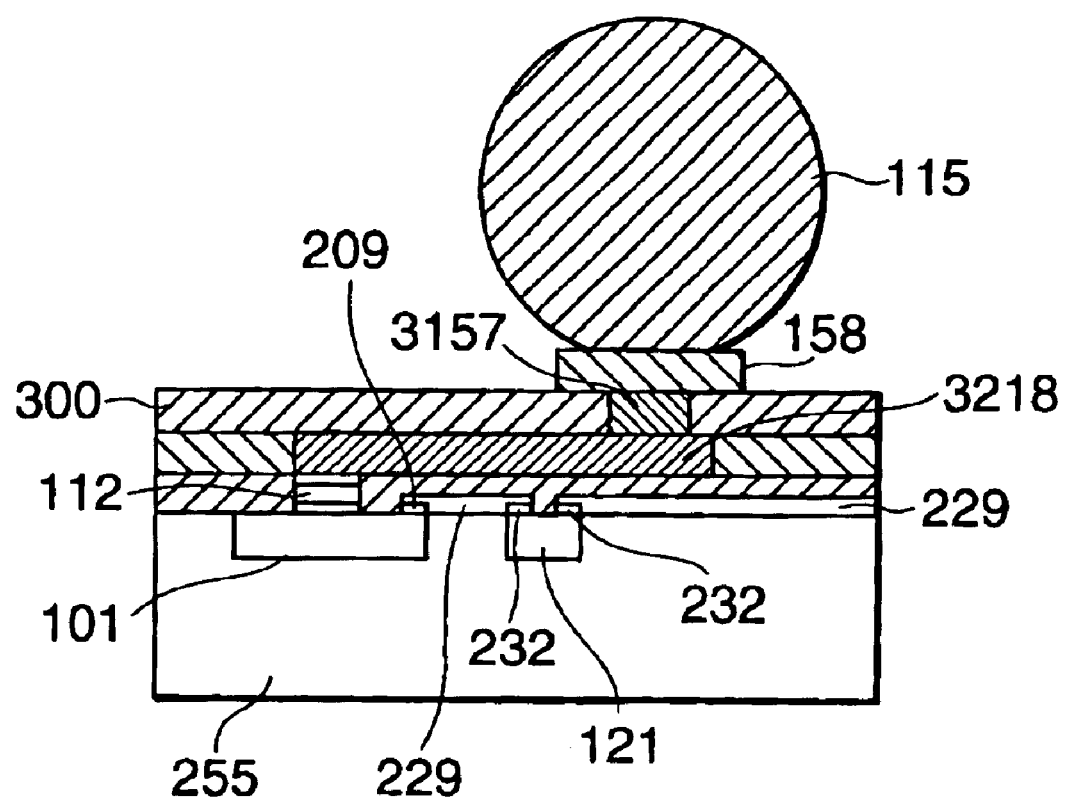
FIG. 28 is a sectional view of the flip chip IC of FIG. 27.

For example, if the signal drawer wire 3218 is one-layer wiring, the inter-signal wire 229 of the internal cell one-layer wiring, and the signal drawer wire 3218 and the inter-signal wire 229 are rum side by side at 200 $\mu$m/min. of a solder ball pitch in the conventional example of FIG. 28, assuming that unit capacitance between the one-layer wiring and three-layer wiring is 0.125 fF/$\mu$m, then coupled capacitance is 25 fG. Thus, in the conventional example, a ratio of parasitic capacitance between the one-layer wiring and the substrate to that between the one-layer wiring and the three-layer wiring is set to 2:1, generating jitters and crosstalk noise to cause an erroneous operation.

On the other hand, according to the embodiment, no drawer wires are present, signal wires of the internal cell 121 are prevented from running side by side, and coupled capacitance becomes 0 fF by the shield wires 156a and 156b. Thus, it is possible to prevent any jitters and erroneous operations caused by crosstalk noise.

Figure 32:
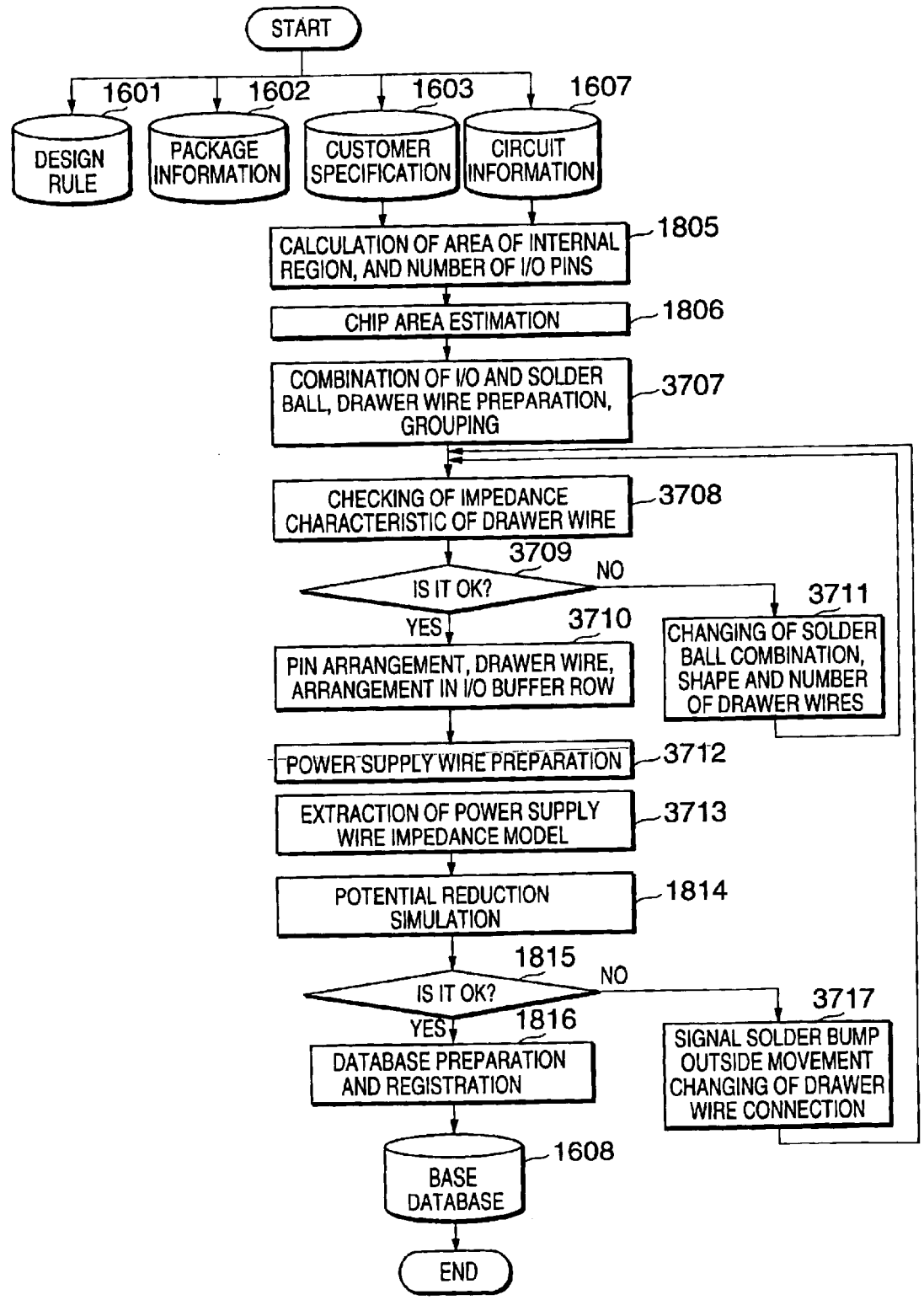
FIG. 32 is a flowchart showing a conventional method of designing a base of a flip chip IC.

Further, according to the embodiment, as shown in the flowcharts of FIGS. 20 and 22, the chip layout of the FC IC can be formed by adding the steps 1820, 1821, 1822, 1824, and 1810 are added, and combining the unit layout data 1823 nondependent on the customer specification, the steps 3707, 3708, 3709, 3710, 3711, 3712 and 3713 of the conventional example can be omitted, and the base designing process can be simplified from the conventional step 3607 (FIG. 32) to the step 1604 (FIG. 22). Thus, it is possible to design the chip layout of the FC IC by the small number of steps after the establishment of the customer information.

In the conventional base designing, if a problem such as impedance unmatching or a potential reduction occurs as a result of arranging the group 3453, and the GND and power supply wires, the grouped layout information must be adjusted or corrected, and return steps are many in this case, consequently extending design TAT.

On the other hand, according to the embodiment, even if there is a problem of a potential reduction, return steps are only four, i.e., the steps 1817, 1810, 1814 and 1815. Thus, design TAT can be shortened. Moreover, according to the embodiment, even if the specification or design is changed, such a change can be dealt with by only rearranging the units.

Therefore, while ten days are necessary for group creation, arrangement, power supply model extraction and potential reduction simulation in the conventional example, only two days are necessary for unit creation and arrangement, and one day for power supply model extraction and potential reduction simulation in the embodiment, advantageously shortening design TAT (process days) to three days. Moreover, since a change in specification or design can be dealt with only by rearranging the units, design TAT needing five days to change the specification or design in the conventional example can be advantageously shortened to 1.5 days.

Figure 23:
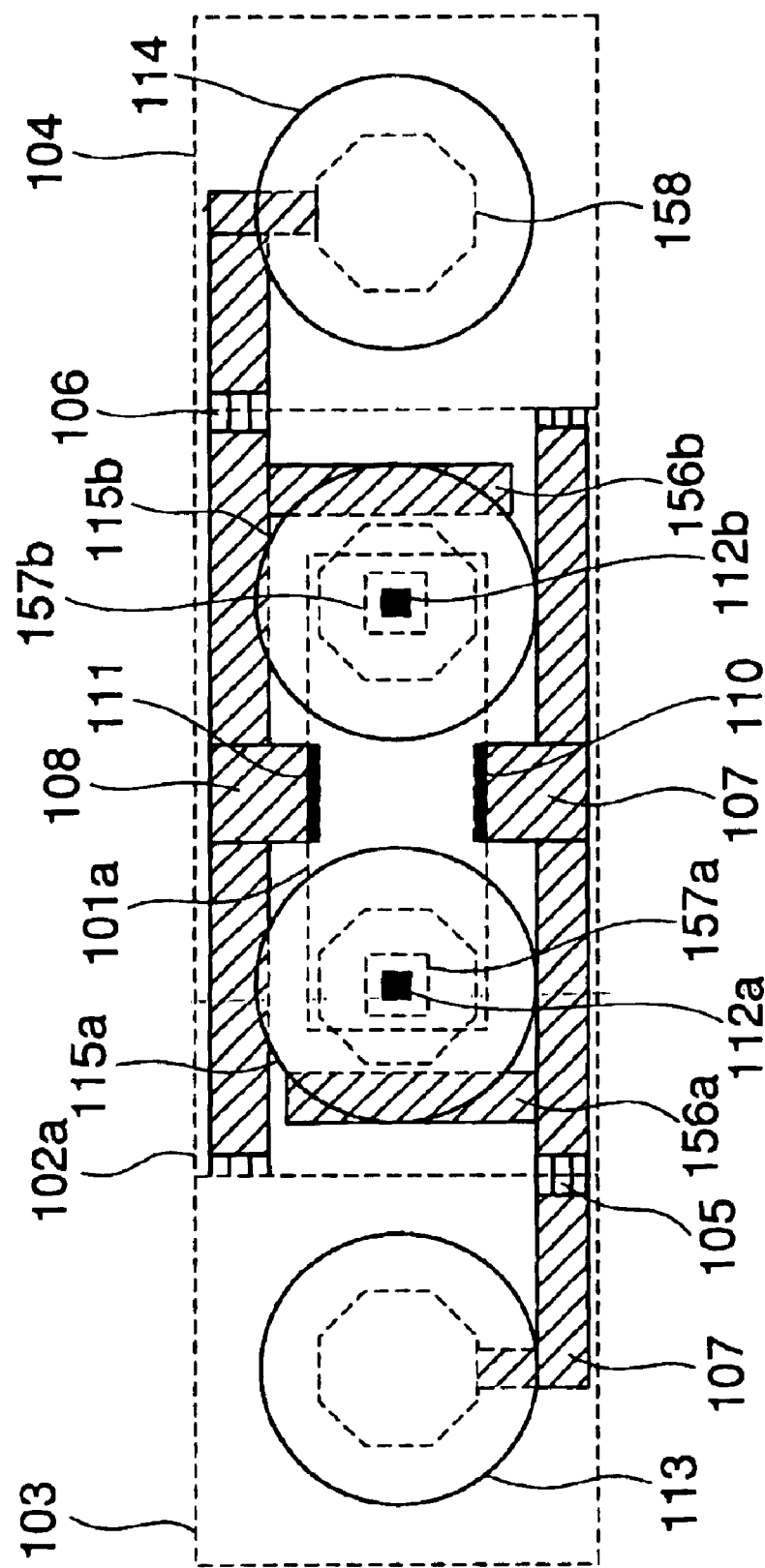
FIG. 23 is a plan view showing a layout structure of a flip chip IC according to a second embodiment of the present invention.

Next, detailed description will be made of a second embodiment of the present invention with reference to the accompanying drawings. FIG. 23 is a plan view showing a layout structure of an FC IC according to a second embodiment of the present invention. Components similar to those of the first embodiment are denoted by similar reference numerals. In FIG. 23, the FC IC is seen through from above.

In the embodiment, two I/O buffer units 102a are provided, each of which includes a complementary signal I/O buffer 101a formed in a unit to have two I/O buffer signal terminals 112a and 112b for processing two complementary signals.

In the embodiment, an I/O buffer GND unit 103, the two I/O buffer unit 102a, an I/O buffer power supply unit 104 are arranged on a substrate. An internal cell 121 is arranged in a region excluding the I/O buffer 101a.

Connection of the I/O buffer signal terminals 112a and 112b is similar to that of the first embodiment. That is, the I/O buffer signal terminal 112a and a signal solder ball 115a are connected to each other through a through-hole 157a formed on the signal terminal 112a, and an upper barrier metal 158 formed on the upper layer of the through-hole 157a. Also, the I/O buffer signal terminal 112b and a signal solder ball 115b are connected to each other through a through-hole 157b formed on the signal terminal 112b, and a barrier metal 158 formed on the upper layer of the through-hole 157b.

An I/O buffer GND terminal 110 of the I/O buffer 101a is connected to an I/O buffer GND solder ball 113 through an I/O buffer GND wire 107, an I/O buffer unit GND terminal 105, and the upper barrier metal 158.

Similarly, an I/O buffet power supply terminal 111 of the I/O buffer 101a is connected to an I/O buffer power supply solder ball 114 through an I/O buffer power supply wire 108, an I/O buffer unit power supply terminal 106, and the upper barrier metal 158. Other constitutions are similar to those of the first embodiment, and thus description thereof will be omitted.

Figure 24:
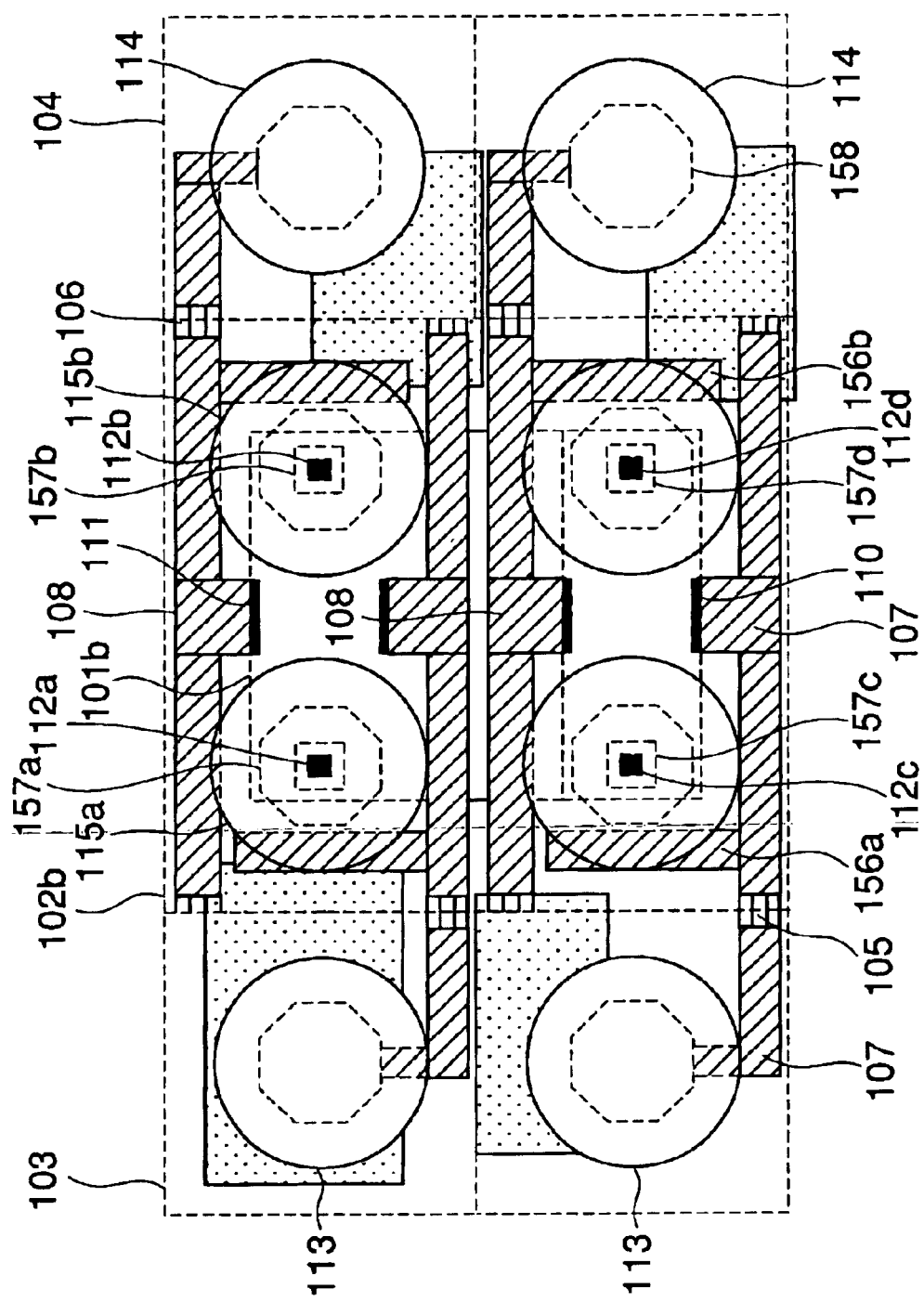
FIG. 24 is a plan view showing a layout structure of a flip chip IC according to a third embodiment of the present invention.

Next, detailed description will be made of a third embodiment of the present invention with reference to the accompanying drawings. FIG. 24 is a plan view showing a layout structure of an FC IC according to a third embodiment of the present invention. Components similar to those of the first embodiment are denoted by similar reference numerals. In FIG. 24, the FC IC is seen through from above.

In the embodiment, four I/O buffer units 102b are provided, each of which includes a complementary signal I/O buffer 101b formed in a unit to have two I/O buffer signal terminals 112a and 112b for processing two complementary signals, and two end terminals 112c and 112d.

In the embodiment, an I/O buffer GND unit 103, the four I/O buffer unit 102b, an I/O buffer power supply unit 104 are arranged on a substrate. An internal cell 121 is arranged in a region excluding the I/O buffer 101b.

Connection of the I/O buffer signal terminals 112a and 112b and the I/O buffet end terminals 112c and 112d is similar to that of the first embodiment. That is, the I/O buffer signal terminal 112a and a signal solder ball 115a are connected to each other through a through-hole 157a formed on the signal terminal 112a, and a barrier metal 158 formed on the upper layer of the through-hole 157a. Also, the I/O buffer signal terminal 112b and a signal solder ball 115b are connected to each other through a through-hole 157b formed on the signal terminal 112b, and a barrier metal 158 formed on the upper layer of the through-hole 157b.

The I/O buffer end terminal 112c and a signal solder ball 115c are connected to each other through a through-hole 157c formed on the end terminal 112c, and a barrier metal 158 formed on the upper layer of the through-hole 157c. Also, the I/O buffer end terminal 112d and a signal solder ball 115d are connected to each other through a through-hole 157d formed on the end terminal 112d, and a barrier metal 158 formed on the upper layer of the through-hole 157d.

An I/O buffer GND terminal 110 of the I/O buffer 101b is connected to an I/O buffer GND solder ball 113 through an I/O buffer GND wire 107, an I/O buffer unit GND terminal 105, and the upper barrier metal 158.

Similarly, an I/O buffet power supply terminal 111 of the I/O buffer 101b is connected to an I/O buffer power supply solder ball 114 through an I/O buffer power supply wire 108, an I/O buffer unit power supply terminal 106, and the upper barrier metal 158. Other constitutions are similar to those of the first embodiment, and thus description thereof will be omitted.

Figure 25:
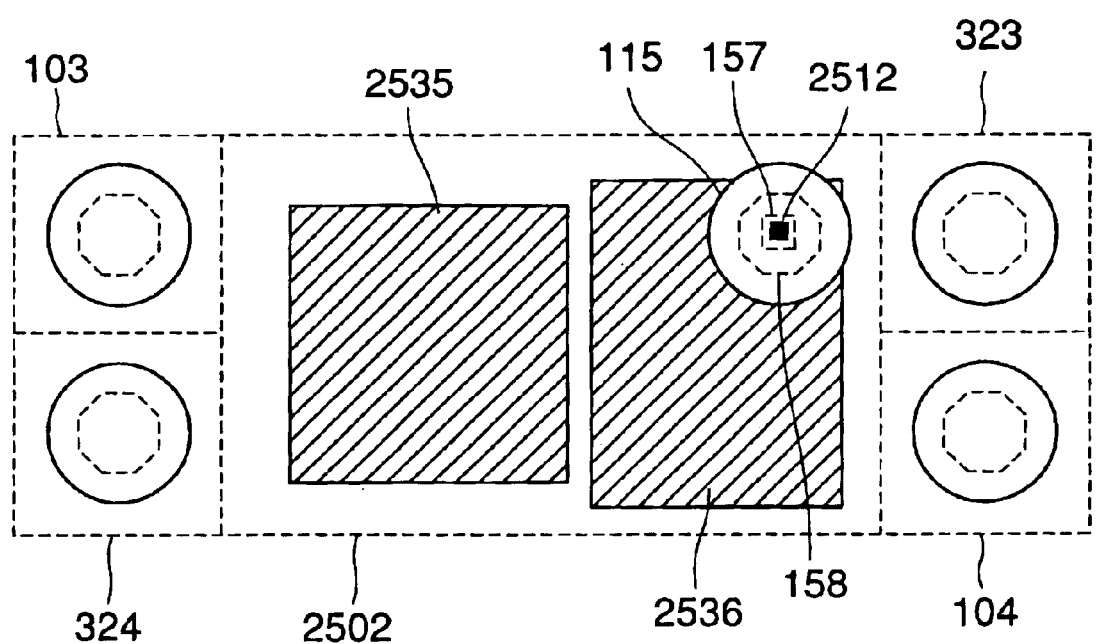
FIG. 25 is a plan view showing a layout structure of a flip chip IC according to a fourth embodiment of the present invention.
Figure 26:
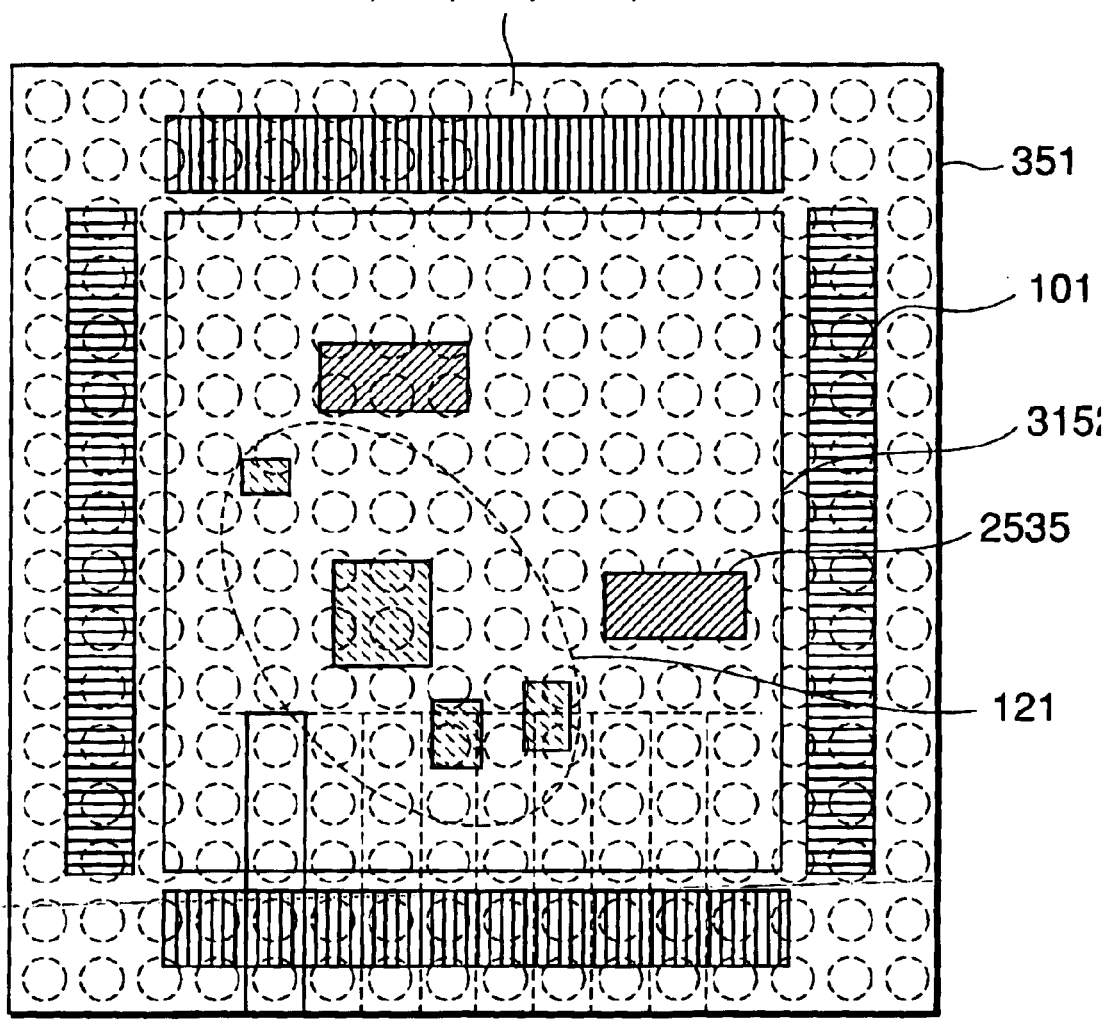
FIG. 26 is a plan view showing a layout structure of a flip chip IC according to a first conventional example.
Figure 27:
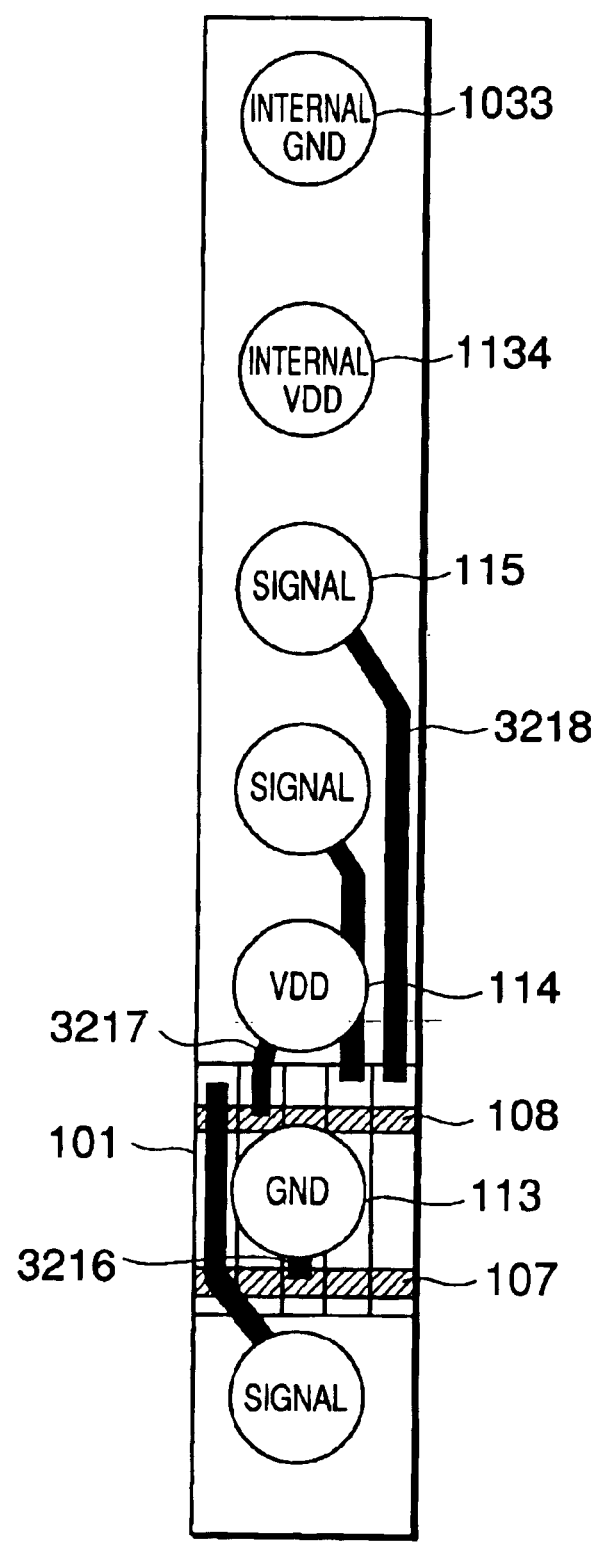
FIG. 27 is a partially expanded plan view of the flip chip IC of FIG. 26.

Next, detailed description will be made of a fourth embodiment of the present invention with reference to the accompanying drawings. FIG. 25 is a plan view showing a layout structure of an FC IC according to a fourth embodiment of the present invention. Components similar to those of the first embodiment are denoted by similar reference numerals. In FIG. 25, the FC IC is seen through from above.

In the embodiment, a RAM/macrounit 2502 is provided, which includes a plurality of RAM or macrocells arranged and formed in a unit in a region having a size larger by an integral multiple than a unit region 459.

In the embodiment, an I/O buffer GND unit 103, the two I/O buffer unit 102a, a RAM/macro unit 2502 having one RAM 2535 and one macrocell 2536 larger in size than the unit region 459 arranged in a region having a size larger by six times than the unit region 459, an I/O buffer power supply unit 104, an internal cell GND unit 323, and an internal cell power supply unit 324 are arranged on a substrate. An internal cell 121 is arranged in a region excluding the RAM/macro unit 2502.

A macrosignal terminal 2512 of the macrocell 2536 is connected to a signal solder ball 115 directly above through a through-hole 157 formed on the signal terminal 1512, and an upper barrier metal 158 formed on the upper layer of the through-hole 157. Other constitutions are similar to those of the first embodiment, and thus description thereof will be omitted. In order to prevent α rays radiated from the solder ball, no solder balls may be arranged on the RAM 2535 (or macrocell 2536).

According to the present invention, the I/O buffer unit including the signal solder ball, the I/O buffer, the first I/O buffer GND wire, and the first I/O buffer power supply wire is arranged on the chip. Thus, since the same I/O buffer unit is used for the respective I/O buffers is used, a wiring length between the I/O buffer and the signal solder ball is equal from one I/O buffer to another, and a difference in impedance characteristics is reduced between signals processed by the I/O buffers. Therefore, it is possible to reduce a skewing difference between the signals. Since a wiring length between the I/O buffer and the signal solder ball is set shorter than that in the conventional case, and the passage of the signal drawer wire on the internal cell is prevented, it is possible to reduce the effect of crosstalk noise between the I/O buffer and the internal cell, and jitters of the wire between the signals. Moreover, even if the arrangement of the I/O buffer unit is changed according to the specification of each product, no changes occur between the I/O buffer and the signal solder ball. Thus, any changes in the impedance characteristic between the I/O buffer and the signal solder ball can be prevented.

Only by arranging the I/O buffer GND unit adjacently to the I/O buffer unit, the I/O buffer GND wire is automatically connected,between the units. Thus, the process of connecting the I/O buffer GND wire can be made unnecessary.

Only by arranging the I/O buffer power supply unit adjacently to the I/O buffer unit, the I/O buffer power supply wire is automatically connected between the units. Thus, the process of connecting the I/O buffer power supply wire can be made unnecessary.

Only by arranging the internal cell GND unit or the GND unit having no solder balls adjacently to the other unit, the internal cell wire is automatically connected between the units. Thus, the process of connecting the internal GND wire can be made unnecessary.

Only by arranging the internal cell power supply unit or the power supply unit having no solder balls adjacently to the other unit, the internal cell power supply wire is automatically connected between the units. Thus, the process of connecting the internal cell power supply wire can be made unnecessary.

By arranging the I/O buffer directly below the signal solder ball, and connecting the signal terminal of the I/O buffer to the signal solder ball through the through-hole, the I/O buffer and the signal solder ball can be connected to each other by a shortest distance, wiring impedance can be reduced, and it is not necessary to check an impedance characteristic between the I/O buffer and the signal solder ball for each product.

By arranging the shield wire around the through-hole, parasitic capacitance can be reduced between the signal drawer wire and the inter-signal wire of the internal cell. Thus, it is possible to reduce the effect of cross talk noise between the I/O buffer and the internal cell, and jitters of the inter-signal wire.

Furthermore, by arranging the internal cell GND and power supply wires of each unit at a pitch smaller by 1/integer than the solder ball pitch, it is possible to easily connect the internal cell GND and power supply wires exceptionally between the adjacent units.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A flip chip semiconductor integrated circuit comprising:
   an internal cell;
   a solder ball;
   a GND or power supply wire; and
   an I/O buffer unit arranged on a chip, the I/O buffer unit including an I/O buffer as an interface between the internal cell and an external unit;
   wherein the internal cell, solder ball and ground or power supply wire are arranged in a unit, and
   the I/O buffer unit includes; a signal solder ball formed on the I/O buffer unit for transferring signals with the external unit; an I/O buffer having a signal terminal connected to the signal solder ball; a first I/O buffer GND wire connected to a GND terminal of the I/O buffer; and a first I/O buffer power supply wire connected to a power supply terminal of the I/O buffer.

2. The flip chip semiconductor integrated circuit according to claim 1, further comprising an I/O buffer GND unit arranged on the chip, which includes an I/O buffer GND solder ball for supplying a GND potential from the external unit to the I/O buffer, and a second I/O buffer GND wire connected to the I/O buffer GND solder ball, and to the first I/O buffer GND wire of the adjacently arranged I/O buffer unit.

3. The flip chip semiconductor integrated circuit according to claim 1, further comprising an I/O buffer power supply unit arranged on the chip, which includes an I/O buffer power supply solder ball for supplying a power supply potential from the external unit to the I/O buffer, and a second I/O buffer power supply wire connected to the I/O buffer power supply solder ball, and to the first I/O buffer power supply wire of the adjacently arranged I/O buffer unit.

4. The flip chip semiconductor integrated circuit according to claim 1, further comprising an internal cell GND unit arranged on the chip, which includes an internal cell GND solder ball for supplying a GND potential from the external unit to the internal cell, and a second internal cell GND wire connected to the internal cell GND solder ball, and to a first internal cell GND wire of another adjacently arranged unit.

5. The flip chip semiconductor integrated circuit according to claim 1, further comprising an internal cell power supply unit arranged on the chip, which includes an internal cell power supply solder ball for supplying a power supply potential from the external unit to the internal cell, and a second internal cell power supply wire connected to the internal cell power supply solder ball, and to a first internal cell power supply wire of another adjacently arranged unit.

6. The flip chip semiconductor integrated circuit according to claim 1, further comprising a GND unit having no solder balls arranged on the chip, which includes a third internal cell GND wire connected to a first internal cell GND wire of another adjacently arranged unit.

7. The flip chip semiconductor integrated circuit according to claim 1, further comprising a power supply unit having no solder balls arranged on the chip, which includes a third internal cell power supply wire connected to a first internal cell power supply wire of another adjacently arranged unit.

8. The flip chip semiconductor integrated circuit according to claim 1, wherein each unit has a size equal to/smaller than a solder ball pitch.

9. A flip chip semiconductor integrated circuit comprising:
an internal cell;
an I/O buffer as an interface between the internal cell and an external unit;
a solder ball;
a GND or power supply wire; and
an I/O buffer unit arranged on a chip,
wherein the I/O buffer unit includes: a signal solder ball for transferring signals with the external unit; an I/O buffer having a signal terminal connected to the signal solder ball; a first I/O buffer GND wire connected to a GND terminal of the I/O butter and a first I/O buffer power supply wire connected to a power supply terminal of the I/O buffer, and
wherein die I/O buffer is arranged directly below the signal solder ball, and the signal terminal of the I/O buffer is connected through a through-hole to the signal solder ball.

10. The flip chip semiconductor integrated circuit according to claim 9, wherein the I/O buffer unit includes a shield wire arranged around to the through-hole, and connected to the first I/O buffer GND wire or the first I/O buffer power supply wire.

11. The flip chip semiconductor integrated circuit according to claim 1, further comprising a unit arranged on the chip, which has a size larger by an integral multiple than a solder ball pitch, and include, a cell larger in size than the solder ball pitch.

12. The flip chip semiconductor integrated circuit according to claim 1, wherein the internal cell GND and power supply wires of each unit are arranged at a pitch equal to 1/integer of a solder ball pitch.

13. The flip chip semiconductor integrated circuit according to claim 9, further comprising an I/O buffer GND unit arranged on the chip, which includes an I/O buffer GND solder ball for supplying a GND potential from the external unit to the I/O buffer, and a second I/O buffer GND wire connected to the I/O buffer GND solder ball, and to the first I/O buffer GND wire of the adjacently arranged I/O buffer unit.

14. The flip chip semiconductor integrated circuit according to 9, further comprising an I/O buffer power supply unit arranged on the chip, which includes an I/O buffer power supply solder ball for supplying a power supply potential from the external unit to the I/O buffer, and a second I/O buffer power supply wire connected to the I/O buffer power supply solder ball, and to the first I/O buffer power supply wire of the adjacently arranged I/O buffer unit.

15. The flip chip semiconductor integrated circuit according to claim 9, further comprising an internal cell GND unit arranged on the chip, which includes an internal cell GND solder ball for supplying a GND potential from the external unit to the internal cell, and a second internal cell GND wire connected to the internal cell GND solder ball, and to a first internal cell GND wire of another adjacently arranged unit.

16. The flip chip semiconductor integrated circuit according to claim 9, further comprising an internal cell power supply unit arranged on the chip, which includes an internal cell power supply solder ball for supplying a power supply potential from the external unit to the internal cell, and a second internal cell power supply wire connected to the internal cell power supply solder ball, and to a first internal cell power supply wire of another adjacently arranged unit.

17. The flip chip semiconductor integrated circuit according to claim 9, further comprising a GND unit having no solder bells arranged on the chip, which includes a third internal cell GND wire connected to a first internal cell GND wire of another adjacently arranged unit.

18. The flip chip semiconductor integrated circuit according to claim 9, further comprising a power supply unit having no solder balls arranged on the chip, which includes a third internal cell power supply wire connected to a first internal cell power supply wire of another adjacently arranged unit.

19. The flip chip semiconductor integrated circuit according to claim 9, wherein each unit has a size equal to/smaller than a solder bell pitch.

* * * * *

UNITED STATES PATENT AND TRADEMARK OFFICE
CERTIFICATE OF CORRECTION

PATENT NO. : 6,841,886 B2
DATED : January 11, 2005
INVENTOR(S) : Nakata et al.

It is certified that error appears in the above-identified patent and that said Letters Patent is hereby corrected as shown below:

<u>Column 21,</u>
Line 61, "die" should be -- the --.

<u>Column 22,</u>
Line 9, "include, a cell" should be -- includes a cell --.
Line 25, "to 9" should be -- to claim 9 --.
Line 50, "bells" should be -- balls --.
Line 61, "bell" should be -- ball --.

Signed and Sealed this

Twenty-fourth Day of May, 2005

JON W. DUDAS
*Director of the United States Patent and Trademark Office*